US00RE39064E

(19) United States
(12) Reissued Patent
Sakai et al.

(10) Patent Number: US RE39,064 E
(45) Date of Reissued Patent: Apr. 18, 2006

(54) ELECTRONIC DEVICE MANUFACTURING APPARATUS AND METHOD FOR MANUFACTURING ELECTRONIC DEVICE

(75) Inventors: Osamu Sakai, Naka-ken (JP); Katsuhiko Nomoto, Kashiwara (JP)

(73) Assignee: Sharp Kabushiki Kaisha, Osaka (JP)

(21) Appl. No.: 10/283,094

(22) Filed: Oct. 30, 2002

Related U.S. Patent Documents

Reissue of:
(64) Patent No.: 6,142,096
Issued: Nov. 7, 2000
Appl. No.: 08/856,678
Filed: May 15, 1997

(30) Foreign Application Priority Data

May 16, 1996 (JP) ..... 8-122055
Nov. 15, 1996 (JP) ..... 8-305359

(51) Int. Cl.
*C23C 16/509* (2006.01)

(52) U.S. Cl. ..... 118/723 E; 118/728; 156/345.43; 156/345.44; 156/345.45; 216/67

(58) Field of Classification Search ..... 118/723 E, 118/715, 723 R, 723 ER, 728; 156/345.43, 156/345.44, 345.47, 345.45, 643; 315/111; 422/186; 204/192, 298; 343/769
See application file for complete search history.

(56) References Cited

U.S. PATENT DOCUMENTS 3,616,405 A * 10/1971 Beaudry ..... 204/192.12
4,349,409 A * 9/1982 Shibayama et al. ..... 438/714
5,055,853 A * 10/1991 Garnier ..... 343/769
5,210,466 A * 5/1993 Collins et al. ..... 315/111.21
5,221,427 A * 6/1993 Koinuma et al. ..... 156/643
5,272,417 A * 12/1993 Ohmi
5,733,511 A * 3/1998 De Francesco ..... 422/186.05
5,795,452 A * 8/1998 Kinoshita et al. ..... 204/298.37
5,800,618 A * 9/1998 Niori et al. ..... 118/723 E
5,838,111 A * 11/1998 Hayashi et al. ..... 315/111.21

FOREIGN PATENT DOCUMENTS

EP 0469597 A * 2/1992
JP 58-145100 * 8/1983
JP 6-61185 * 3/1994
JP 6-77144 * 3/1994

OTHER PUBLICATIONS

Marbury, R.E., Power Capacitors, New York, McGraw–Hill Book Co., 1st Ed., Jan. 1949.*
Dummer, G.W.A., Variable Capacitors and Trimmers, London, Pitman, Jan. 1957.*
Rayner, J.P., Cheetham, A.D., French, G.N., Radio Frequency Matching for Helicon Plasma Sources, J. Vac. Sci. Technol. A 14(4), Jul. 1996.*
A. A. Howling et al, *J. Vac. Sci. Technol*, A10(4), pp. 1080–1085, 1992.*
T. Kitamura et al, *Plasma Sources Sci. Technol. 2*, pp. 40–45, 1993.*
S. Oda, *Plasma Sources Sci. Technol. 2*, pp. 26–29, 1993.*
Brian Chapman, *Glow Discharge Processes*, pp. 139–149, 1980.*
Heintze et al, "VHF Plasma Deposition for Thin–Film Solar Cells", Progress in Photovoltaics Research and Applications, vol. 1, No. 3, Jul. 1993, Chichester GB, pp. 213–224.*

* cited by examiner

*Primary Examiner*—Rudy Zervigon
(74) *Attorney, Agent, or Firm*—Nixon & Vanderhye, P.C.

(57) ABSTRACT

An electronic device manufacturing apparatus includes: a reaction chamber including a wall having a ground potential level; a reaction gas inlet for introducing a reaction gas into the reaction chamber; a high frequency power generator for generating a high frequency voltage for exciting the reaction gas into plasma state or dissociated state; a cathode electrode connected to the high frequency power generator; and a floating capacitance formed between a potential level of the cathode electrode and the ground potential level. An impedance adjusting capacitor is inserted so as to be in series with the floating capacitance. The impedance adjusting capacitor has a capacitance value less than that of the floating capacitance.

28 Claims, 20 Drawing Sheets

PRIOR ART

PRIOR ART

○ Only normal inter-electrode discharge

△ Inter-electrode discharge + locationally abnormal discharge

× Only locationally abnormal discharge

PRIOR ART

ELECTRONIC DEVICE MANUFACTURING APPARATUS AND METHOD FOR MANUFACTURING ELECTRONIC DEVICE

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to an electronic device manufacturing apparatus. More particularly, the present invention relates to an electronic device manufacturing apparatus and a method for manufacturing an electronic device using such an apparatus, which are suitable for plasma excitation chemical vapor deposition (hereinafter, referred to as a "plasma CVD apparatus") or for plasma etching. Plasma CVD apparatuses are used in electronic industries for producing a semiconductor film, such as an amorphous silicon hydride thin film (hereinafter, referred to as an "a-Si:H thin film"), or an insulating film. Plasma etching apparatuses are used for processing a semiconductor device, a liquid crystal device, and the like.

2. Description of the Related Art

Plasma CVD apparatuses are used to deposit a thin film through plasma excitation and plasma dissociation of a material gas. On the other hand, plasma dry etching apparatuses are used to process a semiconductor device, a liquid crystal device, and the like. The plasma dry etching apparatuses operate based on a principle that plasma particles and active species generated by plasma excitation can be used to etch a film. Recently, these apparatuses have been widely used as electronic device manufacturing apparatuses for depositing/processing a metal film, a semiconductor film, a dielectric film, a crystalline silicon wafer, and the like.

Presently, many of these electronic device manufacturing apparatuses currently utilize a radio wave (about 13.56 MHz, also called an "RF" or an "HF"), or a microwave (about 2.45 GHz, also called an "MW") as an excitation frequency of a power source for generating the plasma.

On the other hand, regarding an excitation frequency of a high frequency power source for generating plasma, recent energetic studies in plasma science have been gradually elucidating the fact that frequencies in the range between the above-noted two frequencies (e.g., about 100 Mhz, also called a "VHF"), both theoretically and experimentally, have suitable characteristics for manufacturing electronic devices. Such studies are described in, for example, the following documents.

(1) J. Vac. Sci. Technol. A10 (1992) 1080, by A. A. Howling et al.

(2) Plasma Sources Sci. Technol. 2 (1993) p. 40–45, by T. Kitamura et al.

(3) Plasma Sources Sci. Technol. 2 (1993) p. 26–29, by S. Oda (4) Japanese Laid-Open Patent Application No. 6-77144

One of the above suitable characteristics for manufacturing electronic devices is that plasma density increases in proportion to the square of the frequency used. That is, the film deposition rate (or the etching rate in the case of an etching apparatus) increases in proportion to the square to the frequency used. Another one of the above suitable characteristics is that the high plasma density is achieved at a relatively low plasma potential. This allows "plasma damages" (i.e., damages to a film or a substrate caused by ion species in plasma) to be suppressed even under such a high-speed deposition/etching conditions.

In the field of electronic industries such as those called "giant microelectronics" (which involves the manufacturing of solar batteries and liquid crystal display devices using an a-Si:H thin film, or photosensitive layers of a photosensitive drum, etc.), the size of a substrate to be processed is large (for example, 40 cm to 60 cm in length). Accordingly, in order to achieve a higher throughput for an apparatus, it is becoming indispensable to provide a reaction chamber in which a plurality of such large substrates can be processed. Similarly, for semiconductor manufacturing apparatuses, it is very important to be able to process a number of substrates at a time in order to realize a high throughput. For these reasons, it is important to increase the size of reaction chamber and thereby to increase the apparatus size (i.e., the size of the reaction region, more particularly, the area of a cathode electrode and an anode electrode).

However, in the apparatuses described in the above documents (1) to (4), the reaction region is considerably small with respect to the wavelength of the high frequency voltage for plasma excitation. For example, for a frequency of 100 MHz, the wavelength is about 3 m, while the reaction region is only about 10 cm or less. Thus, so far, the reaction region of these apparatuses have not been made sufficiently large, and electronic device manufacturing apparatuses suitable for the field of electronic industries of giant microelectronics have not been realized.

According to the inventors of the present invention, the reason why the reaction region must be made so small with respect to the wavelength corresponding to an excitation power source frequency in the VHF range is as follows: when the scale of the reaction region becomes as great as the wavelength corresponding to the excitation power source frequency in the VHF range, electromagnetic waves generated therein begin to have characteristics as a wave which propagates across the reaction region. This causes a change in electromagnetic characteristics in the reaction apparatus. Such a change results in generation of structurally complicated plasma which cannot be controlled.

Hereinafter, such a phenomenon will be further described based on results of experiments conducted using a conventional plasma CVD apparatus 800 shown in FIG. 17. The electrode size of the plasma CVD apparatus 800 used was about 700 mm×700 mm.

When plasma was generated with the plasma CVD apparatus 800 using a frequency of about 13.56 MHz to about 20 MHz, electric discharge occurred only in a normal inter-electrode region, i.e., in a reaction region 83 defined between a cathode electrode 81 and an anode electrode 82 (see FIG. 18). However, it was confirmed that, when a frequency of about 27.12 MHz to about 35 MHz was used, electric discharge occurred not only in the reaction region 83, but also in locationally-abnormal regions (i.e., regions other than the normal inter-electrode region, which are irrelevant to film deposition). The locationally-abnormal regions include side regions 101 beside the reaction region 83 (i.e., regions defined between the side wall of the reaction chamber and either one end of the electrodes 81 and 82), and a region 102 behind the anode electrode 82.

It was also confirmed that, when a frequency was increased to about 40.68 MHz, electric discharge no longer occurred in the normal inter-electrode reaction region 83 and, instead, occurred only in the locationally-abnormal regions such as the side regions 101 and the region 102. As a result, an abnormal circumstance occurred, where no film was deposited on a substrate (or a wafer) on which a film is normally deposited, even though the substrate was properly placed on the surface of the anode electrode 82 in contact with the reaction region 83.

The inventors of the present invention made further examinations for such abnormal discharge while varying the size of the conventional plasma CVD apparatus 800. Among the apparatuses examined each having a square-shaped cathode electrode 81, a relatively small apparatus having an about 200 mm-by-200 mm cathode electrode 81 showed to cause discharge exclusively between electrodes with a frequency up to about 81.36 MHz. However, as can be seen from FIG. 19, as the size of the cathode electrode 81 increased, the upper limit of the frequency with which normal inter-electrode discharge was achieved, decreased.

When the size of the cathode electrode 81 was about 1200 mm by 1200 mm, normal inter-electrode discharge was achieved only with a frequency up to about 13.56 MHz. Moreover, with a frequency of about 40.68 MHz or higher, there only occurred locationally-abnormal discharge (i.e., discharge occurring in regions outside the reaction region between electrodes), so that a film was not deposited on the substrate placed on the surface of the anode electrode 82.

It was thus confirmed that, due to the locationally-abnormal discharge, it is not possible, using the conventional plasma CVD apparatus 800 with a frequency in the VHF range, to cause electric discharge over a large area for large-area film deposition.

As such locationally-abnormal discharge was analyzed using, as parameters, the value of the high frequency used for excitation and the size of the plasma CVD apparatus 800, it has been found that locationally-abnormal discharge occurs along with normal inter-electrode discharge in the range defined by Expression (4) below and as shown in FIG. 19.

$$D \geqq (1/16) \cdot \lambda \quad (4)$$

where D denotes a length of a side of a square-shaped cathode electrode $\lambda$ denotes a wavelength (i.e., the velocity of light/frequency) of the high frequency voltage for excitation It was also confirmed that no discharge occurred between electrodes but, instead, discharge only occurred outside the inter-electrode region in the range of the electrode size D defined by Expression (5) below.

$$D \geqq (1/8) \cdot \lambda \quad (5)$$

Known methods for controlling plasma generated with a high frequency in the RF range are, for example, inserting a DC blocking capacitance element, or providing an impedance adjusting element around an electrode.

The former method is described in, for example, "Glow Discharge Processes" by John Wiley & Sons (1980) B. Chapmann, while the latter is described in, for example, Japanese Laid-Open Patent Application No. 58-145100 and Japanese Laid-Open Patent Application No. 6-61185.

The DC blocking capacitance element as an impedance adjusting element is normally inserted into a location outside the reaction apparatus, where the element is remote from the cathode electrode. In particular, according to the method described in Japanese Laid-Open Patent Application No. 58-145100, the impedance adjusting element is inserted between internal sections of a cathode electrode. On the other hand, according to the method described in Japanese Laid-Open Patent Application No. 6-61185, the element is inserted between the ground potential and an electrode opposing the cathode electrode.

However, these techniques can only be applied to methods which aim to control plasma generation on the assumption that a high frequency in the RF range is used. As these methods are applied to an electronic device manufacturing apparatus which uses a high frequency in the VHF range, the above-mentioned problems cannot be solved for the following reasons.

For example, consider a capacitance-coupled electronic device manufacturing apparatus whose cathode and anode electrodes are parallel-plate electrodes and which is a large-scale apparatus having a reaction region or an electrode having a dimension of about 1 m. As shown in FIG. 17, in order to deposit or etch a film using a capacitance-coupled apparatus, plasma is generated in a region 83 (containing a material gas) between the cathode electrode (high frequency excitation electrode) 81 and the anode electrode 82 opposing the cathode electrode 81 and having a ground potential for a DC voltage, so as to dissociate the material gas.

When the high frequency for excitation is in the RF range, the impedance between the electrodes 81 and 82 can be considered as a capacitance component. In such a case, plasma is generated between the electrodes 81 and 82, so that film deposition is normally achieved.

However, when a frequency in the VHF range is used, the high frequency for excitation begins to have characteristics as an electromagnetic wave which propagates across the reaction region. Accordingly, a group of conductors surrounding the reaction region begins to have an inductance component, so that, at a certain frequency, parallel resonance occurs between the conductor and a floating capacitance of the cathode electrode 81. Then, the impedance in the region between the electrodes 81 and 82 becomes considerably large so that the inter-electrode region equivalently becomes an infinite space. In such a case, it is difficult to generate plasma between the electrodes 81 and 82.

In order to solve this problem, it is necessary to control the impedance between a portion of the apparatus which has the ground potential and the cathode electrode 81. It is difficult to do so based on methods such as the conventional control method of inserting a DC blocking capacitance element, or the method described in Japanese Laid-Open Patent Application No. 58-145100 or Japanese Laid-Open Patent Application No. 6-61185.

As shown in FIG. 17, the DC blocking capacitance element 87 formed from a capacitor is inserted in series between the cathode electrode 81 and a high frequency power source (high frequency power generator) 84. Therefore, it is not possible to control the value of the floating capacitance discussed above. Moreover, in accordance with the method described in Japanese Laid-Open Patent Application No. 58-145100, the impedance between the cathode electrode and an external circuit does not vary essentially. Furthermore, in accordance with the method described in Japanese Laid-Open Patent Application No. 6-61185, the impedance of the cathode electrode side cannot be controlled since the impedance adjusting element is provided on the side of the anode electrode.

More particularly, in the plasma CVD apparatus 800 shown in FIG. 17, considering the propagation of a high frequency in the RF range, the floating capacitance component $C_F$ [C/V=F] occurs mainly below the cathode electrode 81, and the reaction region (or inter-electrode region) 83 between the cathode electrode 81 and the anode electrode 82 becomes an inductance equivalent $L_G$ [Wb/A=H].

Herein, the floating capacitance $C_F$ is given by Expression (8) below.

$$C_F=\epsilon\cdot S_1/d_o \quad (8)$$

where $d_o$ denotes a distance between surfaces of the cathode electrode and the anode electrode opposing each other Using short-circuited waveguide approximation, the inductance $L_G$ is given by Expression (9) below.

$$L_G=A\times\tan\{(2\pi\cdot f\cdot S_2/c)\}/(2\pi\cdot f) \quad (9)$$

where $\epsilon$ denotes a dielectric constant [C/V·m]

$S_1$ denotes an opposing area [$m^2$] of the cathode electrode and the anode electrode d denotes a distance [m] between the cathode electrode and the anode electrode f denotes a frequency [1/S]

$S_2$ denotes the length [m] of the inter-electrode region along the electrode plane, and c denotes the velocity of light [m/S]

"A" in the above Expression (9) is a constant which can be expressed by Expression (10) below.

$$A=(d/W)\cdot\sqrt{(\mu/\epsilon)} \quad (10)$$

where W denotes a width of electrode [m]

$\mu$ denotes a dielectric constant [Wb/A]

Since the floating capacitance $C_F$ and the inductance $L_G$ are in parallel connection between the cathode electrode 81 and the ground level as can be seen from FIG. 17, when the frequency f is equal to the parallel resonance frequency $f_o$ defined by Expression (11) below, parallel resonance occurs, and the impedance in the reaction region 83 between the electrodes 81 and 82 increases to infinity.

$$f_0=1/\{2\pi\cdot\sqrt{(L_G C_F)}\} \quad (11)$$

That is, when the frequency f of the excitation high frequency is equal to or approximately equal to the parallel resonance frequency $f_o$, plasma generation between the electrodes 81 and 82 cannot be expected.

Thus, there occurs a need to control the impedance in the reaction region 83. However, since the size of the reaction region 83 is determined by the size of the substrate on which a film is deposited, it is practically difficult to vary the magnitude of the inductance $L_G$ of the reaction region 83.

For the reasons above, there has been a restriction in increasing the apparatus size (i.e., the size of the reaction region) of the conventional electronic device manufacturing apparatus which uses a high frequency in the VHF range. Accordingly, it has not been possible to improve the mass-productivity of electronic devices.

SUMMARY OF THE INVENTION

According to one aspect of this invention, an electronic device manufacturing apparatus includes: a reaction chamber including a wall having a ground potential level; a reaction gas inlet for introducing a reaction gas into the reaction chamber; a high frequency power generator for generating a high frequency voltage for exciting the reaction gas into plasma state or dissociated state; a cathode electrode connected to the high frequency power generator; and a floating capacitance formed between a potential level of the cathode electrode and the ground potential level. An impedance adjusting capacitor is inserted so as to be in series with the floating capacitance. The impedance adjusting capacitor having a capacitance value less than that of the floating capacitance.

In one embodiment of the invention, the cathode electrode includes an upper cathode electrode and a lower cathode electrode, the apparatus further comprises a DC blocking capacitance element connected in series between the high frequency power generator and the lower cathode electrode. The impedance adjusting capacitor is inserted between the upper and lower cathode electrodes.

In another embodiment of the invention, the impedance adjusting capacitor insulates for a DC voltage the upper cathode electrode from the DC blocking capacitance element.

In still another embodiment of the invention, the impedance adjusting capacitor is inserted at such a location that the impedance adjusting capacitor is equivalently in series with the floating capacitance at a frequency of the high frequency power generator.

In still another embodiment of the invention, the impedance adjusting capacitor is formed so as to insulate for a DC voltage the cathode electrode from the high frequency power generator.

In still another embodiment of the invention, the impedance adjusting capacitor is formed of a dielectric which is provided on the cathode electrode.

In still another embodiment of the invention, when capacitance of the impedance adjusting capacitor and the floating capacitance are connected in series with each other, a total capacitance C is set so as to satisfy Expression (1) below:

$$C\leqq 1/\{L_C\cdot(2\pi\cdot f)^2\} \quad (1)$$

where $L_G$ denotes a magnitude of an inductance component equivalently existing between the cathode electrode and a location which opposes an electrode surface of the cathode electrode and which has a ground potential, $\pi$ denotes pi (ratio of the circumference of a circle to the diameter), and f denotes the frequency of the high frequency voltage used for excitation.

In still another embodiment of the invention, the reaction gas is one of a material gas for depositing a thin film semiconductor and an etching gas for processing a semiconductor device.

In still another embodiment of the invention, the cathode electrode is designed so as to satisfy Expression (4) below:

$$D\geqq(1/16)\cdot\lambda \quad (4)$$

where D denotes a maximum length of a surface of the cathode electrode, and $\lambda$ denotes a wavelength of the high frequency voltage for excitation.

In still another embodiment of the invention, the cathode electrode is designed so as to satisfy Expression (5) below:

$$D\geqq(1/8)\cdot\lambda \quad (5)$$

where D denotes a maximum length of a surface of the cathode electrode, and $\lambda$ denotes a wavelength of the high frequency voltage for excitation.

In still another embodiment of the invention, a high frequency condition of the high frequency power generator is set to be continuous discharge in a high frequency VHF range.

In still another embodiment of the invention, a high frequency condition of the high frequency power generator is set to be pulse discharge in a high frequency VHF range.

According to another aspect of this invention, an electronic device manufacturing apparatus includes: a reaction chamber including a wall having a ground potential level; a reaction gas inlet for introducing a reaction gas into the reaction chamber; a high frequency power generator for generating a high frequency power for exciting the reaction gas into plasma state or dissociated state; a cathode electrode connected to the high frequency power generator; and a floating capacitance $C_F$ formed between a potential level of the cathode electrode and the ground potential level. An impedance adjusting inductor is inserted so as to be in parallel to the floating capacitance $C_F$.

In one embodiment of the invention, the inductance component $L_C$ of the impedance adjusting inductor is set so as to satisfy Expression (2) below:

$$L_C \geqq 1/\{(2\cdot\pi\cdot f)^2\cdot C_F\} \quad (2).$$

In another embodiment of the invention, the inductance component $L_C$ of the impedance adjusting inductor is set so as to satisfy Expression (3) below:

$$L_C < 1/\{(2\cdot\pi\cdot f)^2\cdot C_F\} \quad (3).$$

In still another embodiment of the invention, the reaction chamber is designed so as to satisfy Expression (7) below:

$$D_o \geqq (1/2)\cdot\lambda \quad (7)$$

where $D_o$ denotes a maximum length provided in the reaction chamber parallel to a surface of the cathode electrode, and $\lambda$ denotes a wavelength of the high frequency voltage for excitation.

In still another embodiment of the invention, the impedance adjusting inductor is inserted at such a location that the impedance adjusting capacitor can be considered to be equivalently in parallel to the floating capacitance $C_F$ at a frequency of the high frequency power generator.

In still another embodiment of the invention, the impedance adjusting inductor short-circuits for a DC voltage the cathode electrode to a portion of the reaction chamber having the ground potential level.

In still another embodiment of the invention, an electrode-side dielectric is provided beside the cathode electrode, and the cathode electrode and the electrode-side dielectric form a bottom wall of the reaction chamber.

In still another embodiment of the invention, the cathode electrode is formed in a cylindrical shape. The anode electrode is provided inside the cathode electrode. An electrode-side dielectric is provided at an end of the cathode electrode. The cathode electrode and the electrode-side dielectric form a wall of the reaction chamber.

In still another embodiment of the invention, the apparatus further includes an impedance adjusting capacitor inserted so as to be in series with the floating capacitance. The impedance adjusting capacitor has a capacitance value less than that of the floating capacitance $C_F$.

According to still another aspect of this invention, a method for manufacturing an electronic device using an electronic device manufacturing apparatus is provided. The apparatus includes: a reaction chamber including a wall having a ground potential level; a reaction gas inlet for introducing a reaction gas into the reaction chamber; a high frequency power generator for generating a high frequency voltage for exciting the reaction gas into plasma state or dissociated state; a cathode electrode connected to the high frequency power generator; a floating capacitance formed between a potential level of the cathode electrode and the ground potential level; and an impedance adjusting capacitor inserted so as to be in series with the floating capacitance, having a capacitance value less than that of the floating capacitance. The method includes the steps of: setting a total capacitance C so as to satisfy Expression (1) below:

$$C \leqq 1/\{L_G\cdot(2\pi\cdot f)^2\} \quad (1)$$

where $L_G$ denotes a magnitude of an inductance component equivalent existing between the cathode electrode and a location which opposes an electrode surface of the cathode electrode and which has a ground potential, $\pi$ denotes pi (ratio of the circumference of a circle to the diameter), and f denotes the frequency of the high frequency voltage used for excitation;

introducing one of a material gas and an etching gas through the reaction gas inlet; and performing one of the steps of depositing a thin film on a substrate through plasma excitation and plasma dissociation of the material gas, and etching a film using plasma particles and active species generated by plasma excitation of the etching gas.

According to still another aspect of this invention, a method for manufacturing an electronic device using an electronic device manufacturing apparatus is provided. The apparatus includes: a reaction chamber including a wall having a ground potential level; a reaction gas inlet for introducing a reaction gas into the reaction chamber; a high frequency power generator for generating a high frequency power for exciting the reaction gas into plasma state or dissociated state; a cathode electrode connected to the high frequency power generator; a floating capacitance $C_F$ formed between a potential level of the cathode electrode and the ground potential level; and an impedance adjusting inductor inserted so as to be in parallel to the floating capacitance $C_F$, the inductance component $L_C$ of the impedance adjusting inductor being set so as to satisfy Expression (2) below:

$$L_C \geqq 1/\{(2\cdot\pi\cdot f)^2\cdot C_F\} \quad (2).$$

The method includes the steps of: setting the high frequency voltage so as to satisfy Expression (6) below:

$$D_o \leqq (1/2)\cdot\lambda \quad (6)$$

where $D_o$ denotes a maximum length provided in the reaction chamber parallel to a surface of the cathode electrode, and $\lambda$ denotes a wavelength of the high frequency voltage;

introducing one of a material gas and an etching gas through the reaction gas inlet; and performing one of the steps of depositing a thin film on a substrate through plasma excitation and plasma dissociation of the material gas, and etching a film using plasma particles and active species generated by plasma excitation of the etching gas.

According to still another aspect of this invention, a method for manufacturing an electronic device using an electronic device manufacturing apparatus is provided. The apparatus includes: a reaction chamber including a wall having a ground potential level; a reaction gas inlet for introducing a reaction gas into the reaction chamber; a high frequency power generator for generating a high frequency power for exciting the reaction gas into plasma state or dissociated state; a cathode electrode connected to the high frequency power generator; a floating capacitance $C_F$ formed between a potential level of the cathode electrode and the ground potential level; and an impedance adjusting inductor inserted so as to be in parallel to the floating capacitance $C_F$, the inductance component $L_C$ of the impedance adjusting inductor being set so as to satisfy Expression (3) below:

$$L_C < 1/\{(2\cdot\pi\cdot f)^2\cdot C_F\} \quad (3).$$

The method includes the steps of: setting the high frequency voltage so as to satisfy Expression (7) below:

$$D_o \geqq (1/2)\cdot\lambda \quad (7)$$

where $D_o$ denotes a maximum length provided in the reaction chamber parallel to a surface of the cathode electrode, and $\lambda$ denotes a wavelength of the high frequency voltage;

introducing one of a material gas and an etching gas through the reaction gas inlet; and performing one of the steps of depositing a thin film on a substrate through plasma excitation and plasma dissociation of the material gas, and etching a film using plasma particles and active species generated by plasma excitation of the etching gas.

Thus, the invention described herein makes possible the advantages of: (1) providing an electronic device manufacturing apparatus in which the reaction region can be made larger even when a high frequency in the VHF range is used as a high frequency for plasma excitation power source, and which thus considerably improves the mass-productivity of electronic devices in the field of electronic industries such as those called "giant microelectronics" (which involves the manufacturing of solar batteries and liquid crystal display devices using an a-Si:H thin film, or photosensitive drums, etc.); (2) providing an electronic device manufacturing apparatus in which plasma damage (i.e., damage to a film or a substrate due to ion species in plasma) can be suppressed to a low level even under a high-speed deposition/etching condition, and which can thereby produce electronic devices with improved quality; and (3) providing a method for manufacturing an electronic device using such a manufacturing apparatus.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be generally described with reference to the accompanying figures.

As described above, according to the present invention, an impedance adjusting capacitor is inserted in series with a floating capacitance between a cathode electrode and a DC blocking capacitance element or between the cathode electrode and high frequency power generator. The impedance adjusting capacitance component has a capacitance value less than that of a floating capacitance, which is formed between the cathode electrode (or a location having the same potential as the cathode electrode for a DC voltage) and a chamber wall of a reaction chamber (or a location having the ground potential).

Figure 1:
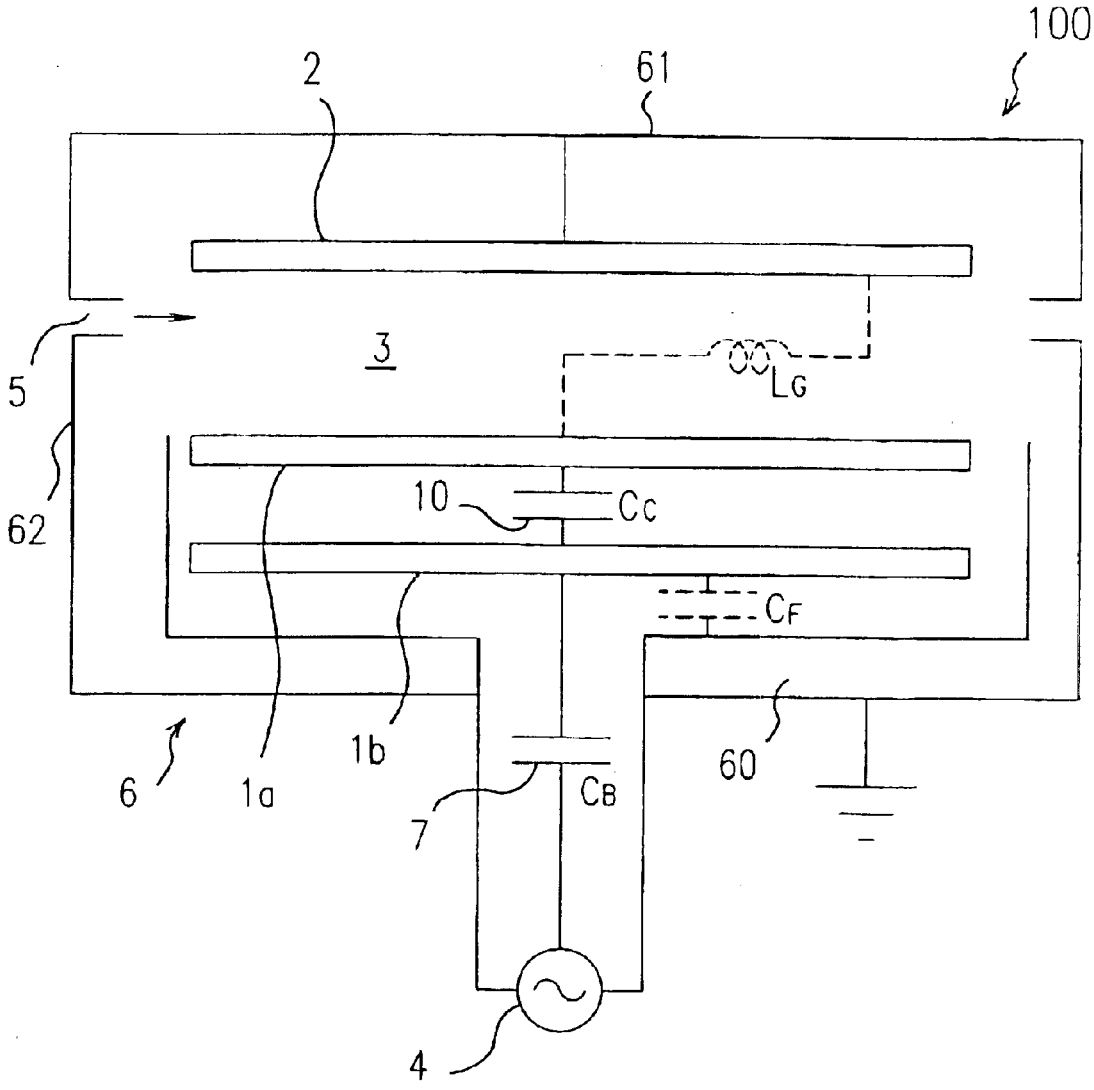
FIG. 1 is a schematic cross-sectional view illustrating Example 1 of the present invention, where the electronic device manufacturing apparatus of the present invention is implemented as a plasma CVD apparatus.

In particular, as in Example 1 shown in FIG. 1, an impedance adjusting capacitor 10 formed of a capacitor is inserted between a cathode electrode 1a and a DC blocking capacitance element 7 formed of a capacitor. Herein, $C_C$ represents the capacitance value of the impedance adjusting capacitor 10; and $C_B$ represents the capacitance value of the DC blocking and capacitance element 7. The cathode electrode shown in FIG. 1, unlike the cathode electrode 81 shown in FIG. 17, includes upper and lower cathode electrodes 1a and 1b which are electrically connecting to each other. A capacitance $C_C$ is formed by connecting the impedance adjusting capacitor 10, which also serves as a DC blocking capacitance element, in series between these cathode electrodes 1a and 1b.

Therefore, the magnitude C of the capacitance of the entire cathode electrode is expressed by Expression (12) below.

$$C=1/\{(1/C_F)+(1/C_C)\} \tag{12}$$

Accordingly, the value C can be changed by a large amount from the value $C_F$ by setting the magnitude of $C_C$ at that of $C_F$ or less. As a result, according to the present invention, the parallel resonance frequency $f_o$ can be kept away from the high frequency range for excitation. With this structure, it is easy to avoid parallel resonance even when a high frequency in the VHF range is used as the high frequency for excitation.

Generally, as the frequency f of a high frequency voltage increases, any conductor to be applied with the voltage begins to have a capacitance component with respect to the ground level potential. Accordingly, even at locations where capacitance component is negligible when DC voltages or high frequencies in the RF range are used, there appears capacitance component in a high frequency range so as to vary a floating capacitance component. Therefore, parallel resonance must be considered in conjunction with the floating capacitance component $C_F$ additionally generated by a frequency increase. In view of this, the impedance adjusting capacitance $C_C$ must be inserted so as to substantially reduce the floating capacitance component.

Parallel resonance frequency can also be controlled without providing an additional circuit element such as the capacitor 10.

Figure 3:
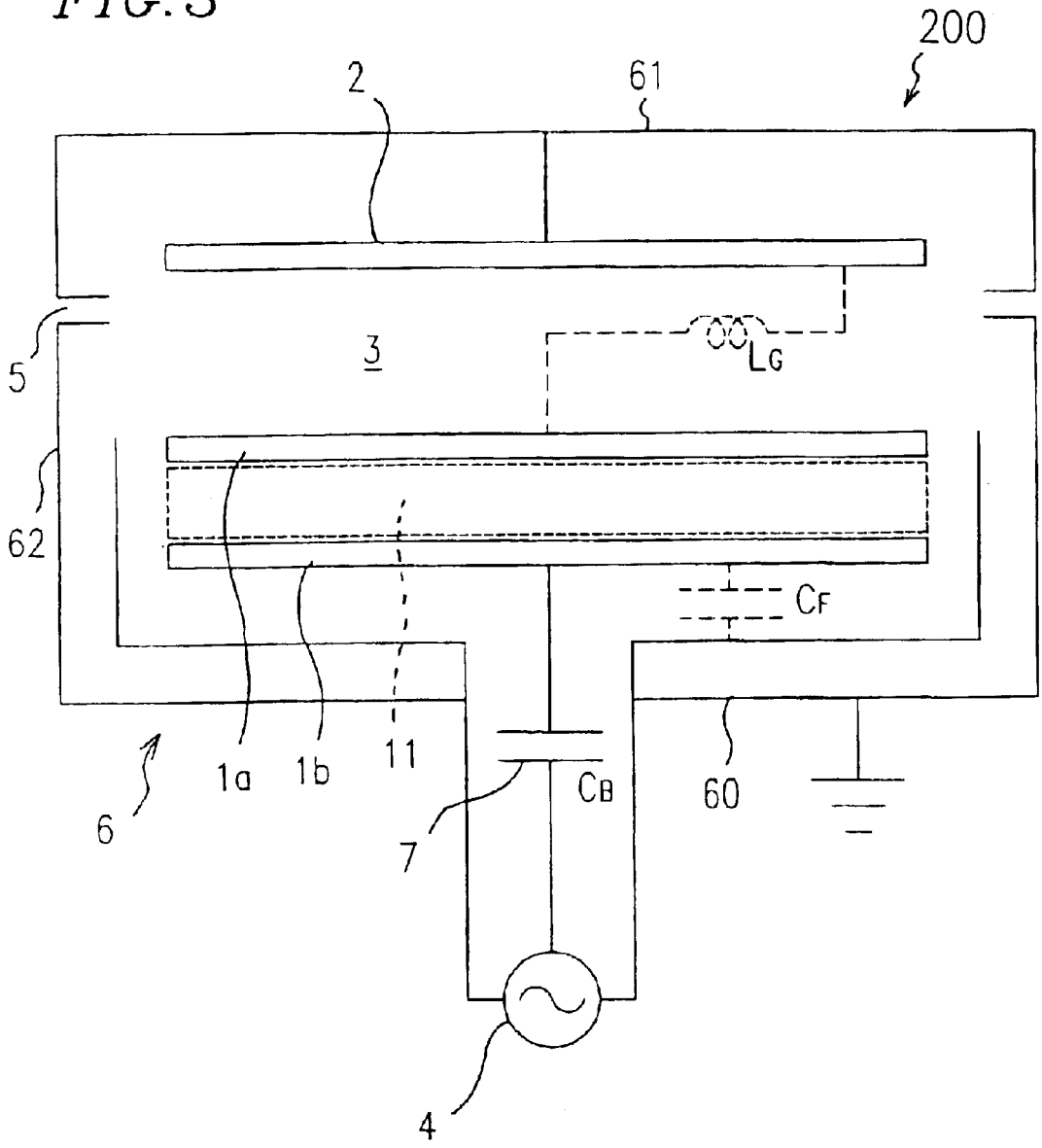
FIG. 3 is a schematic cross-sectional view illustrating Example 2 of the present invention, where the electronic device manufacturing apparatus of the present invention is implemented as a plasma CVD apparatus.

For example, as shown in FIG. 3, the parallel resonance frequency can be controlled by insulating (for a DC voltage) a cathode electrode 1a from a high frequency power generation source 4 by inserting a dielectric 11 and the like between a pair of cathode electrodes 1a and 1b. This is possible because parallel resonance can still be avoided easily as in the case of FIG. 1 since, for high frequency voltages, such insulation is equivalent to the insertion of the capacitance component.

Such insulation is particularly advantageous when there is not a sufficient amount of space around the cathode electrode for a capacitor to be inserted therein.

Basically, parallel resonance occurs due to variations in the magnitude $L_G$ of an inductance component equivalent (i.e., an inductance $L_G$) existing between the cathode electrode 1 or 1a and a location (e.g., an anode electrode 2 shown in FIGS. 1, 3, 6, etc.) which faces the electrode surface of the cathode electrode 1 or 1a and which has the ground potential. Moreover, as described above, the inductance $L_G$ is expressed by a periodical function with respect to a frequency. Therefore, parallel resonance occurs repeatedly at a number of different frequencies.

However, when actually depositing a solar battery for power supply or the like using a plasma CVD apparatus, the size of the apparatus (reaction region) should be around 1 m. Considering this apparatus size, the parallel resonance frequency $f_o$ of the lowest order (when using a high frequency in the VHF range) becomes problematic. For example, when the apparatus size is about 1.6 m by 1.6 m, the inductance $L_G$ is about 0.02 to 0.05 μH, while floating capacitance $C_F$ is in the range from several hundred to several thousand pF. Accordingly, the parallel resonance frequency $f_o$ of the lowest order is about 40 to 100 MHz.

In such a case, to allow any frequency from the RF range to the VHF range to be used for excitation, it is desirable that the parallel resonance frequency $f_o$ can be set to exceed the frequency range of the excitation high frequencies.

To achieve this, as can be known from Expression (12) above, it is necessary to set the magnitude of the total capacitance C (when the impedance adjusting capacitance $C_C$ and the floating capacitance $C_F$ are serially connected to each other) so as to satisfy Expression (1) below.

$$C \leqq 1/\{L_G \cdot (2\pi \cdot f)^2\} \tag{1}$$

The parallel resonance frequency $f_o$ can also be controlled by inserting the inductance component $L_C$ formed by a coil 12 in parallel to the floating capacitance $C_F$. The parallel resonance frequency $f_o$ can be raised in this way because such parallel connection serves as a capacitance equivalent having a magnitude of $C_F - 1/\{(2\pi \cdot f)^2 \cdot L_C\}$. Note that the inductance $L_C$ (i.e., the value of the impedance adjusting inductor) needs to satisfy $C_F - 1/\{(2\pi \cdot f)^2 \cdot L_C\} = 0$. That is, the inductance $L_C$ needs to be $1/\{(2\pi \cdot f)^2 \cdot C_F\}$ (i.e., the value at which the magnitude of the capacitance equivalent becomes minimum) or greater. In other words, it needs to satisfy Expression (2) below.

$$L_C 1/\{(2 \cdot \pi \cdot f)^2 \cdot C_F\} \tag{2}$$

Generally, as described above, when the frequency f of a high frequency voltage to be applied increases, any conductor to be applied with the voltage becomes to have a capacitance component with respect to the ground level. Accordingly, it is necessary to consider parallel resonance in conjunction with the floating capacitance, component $C_F$ additionally generated by a frequency increase, and to set the inductance $L_C$ of the impedance adjusting inductor so as to substantially reduce the floating capacitance component $C_F$.

Although a coil is used as the impedance adjusting inductor 12 having inductance $L_C$, as described below in Example 4 shown in FIG. 6, it is also possible to control the parallel resonance frequency by a measure other than providing a coil. For example, it can be achieved by short-circuiting the cathode electrode 1 to the ground level for a DC voltage using a copper plate or the like. This is possible because, for high frequency voltages, such short-circuiting is equivalent to inserting the impedance adjusting inductor 12.

Such short-circuiting is advantageous particularly when there is not a sufficient amount of space around the cathode electrode 1 for a coil to be inserted therein.

Another solution for the above problem is to completely eliminate parallel resonance. This can be achieved by inserting the inductance component $L_C$ formed of the coil 12 in parallel to the floating capacitance $C_F$. Such parallel connection serves as an inductance equivalent having a magnitude of $(2\pi\cdot f)\cdot L_C/\cdot\{1-(2\pi\cdot f)^2\cdot L_C\cdot C_F\}$. It is thus possible to remove the capacitance component which generates parallel resonance so that there is only the inductance component equivalent around the cathode electrode 1. Herein, the magnitude of the capacitance component $L_C$ of the impedance adjusting inductor needs to be less than $1/\{(2\cdot\pi\cdot f)^2\cdot C_F\}$ (where the equivalent inductance takes a positive value). That is, the inductor component $L_C$ of the impedance adjusting inductor is set so as to satisfy Expression (3) below.

$$L_C<1/\{(2\cdot\pi\cdot f)^2\cdot C_F\} \quad (3)$$

Figure 19:
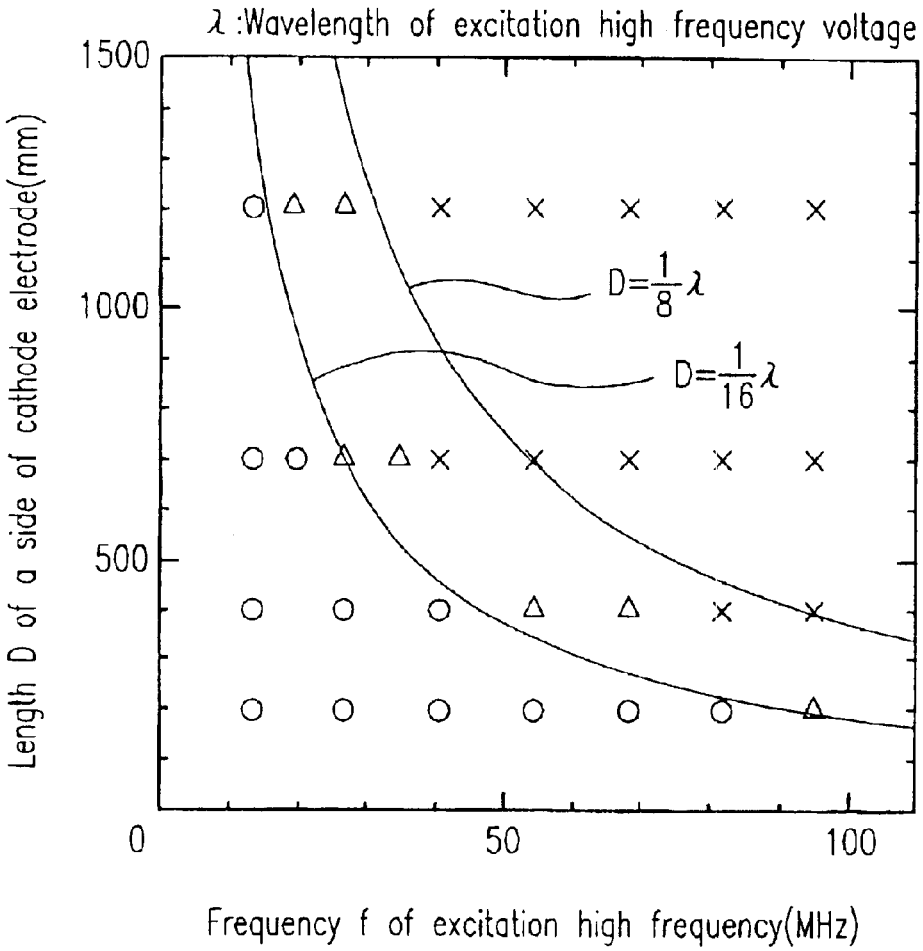
FIG. 19 is a graph illustrating the relationship between the length of a side of a cathode electrode and the frequency of a high frequency for excitation.

Locationally-abnormal discharge occurs in the conventional plasma CVD apparatus 800, as shown in FIG. 19, when the electrode length D is greater than 1/16 the wavelength λ of the high frequency voltage for excitation.

In view of this, according to the present invention, the length D of the cathode electrode is set so as to satisfy Expression (4) below.

$$D\geqq(1/16)\cdot\lambda \quad (4)$$

Thus, locationally-abnormal discharge can be suppressed. With this structure, it is possible to realize electric discharge over a larger area and thereby to deposit a film having a larger area using a high frequency in the VHF range.

Figure 17:
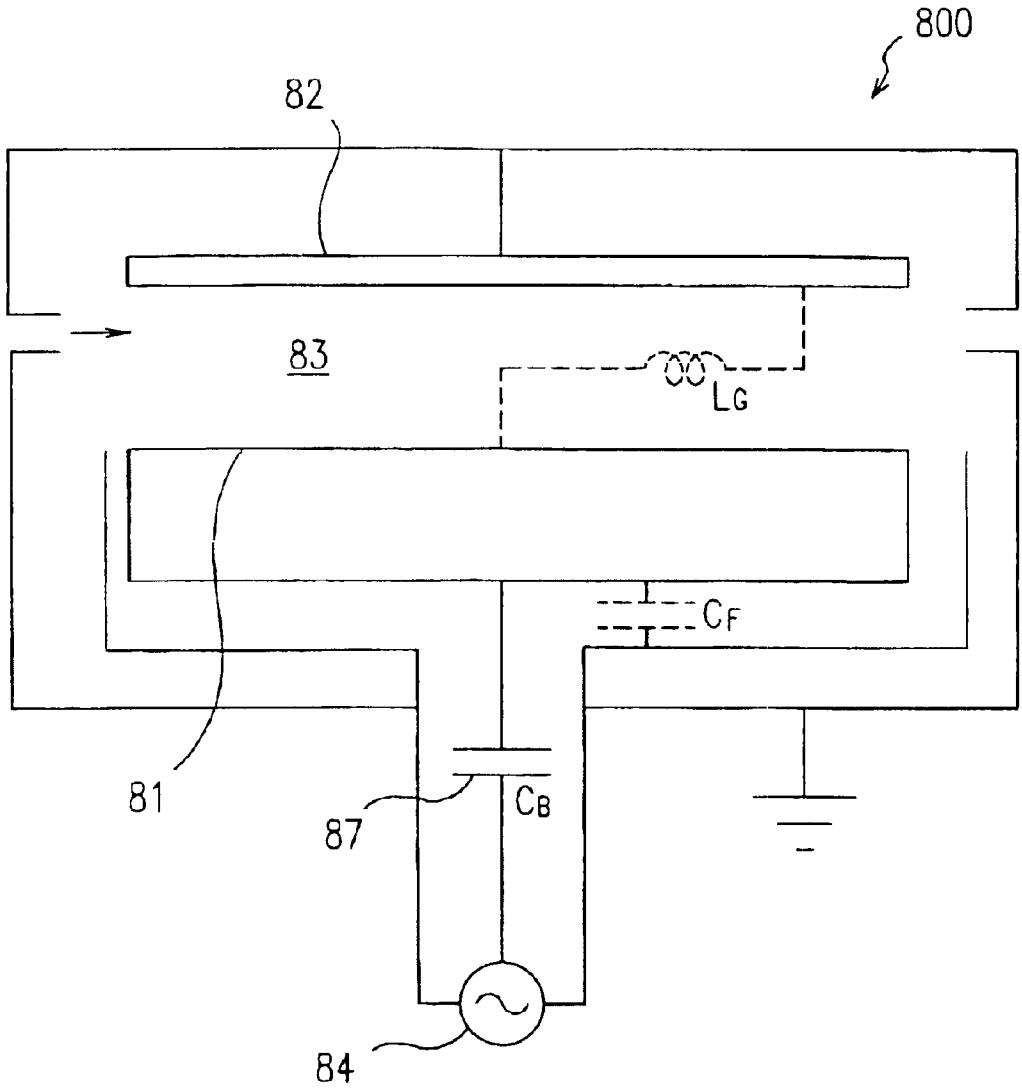
FIG. 17 is a schematic cross-sectional view illustrating a conventional plasma CVD apparatus.
Figure 18:
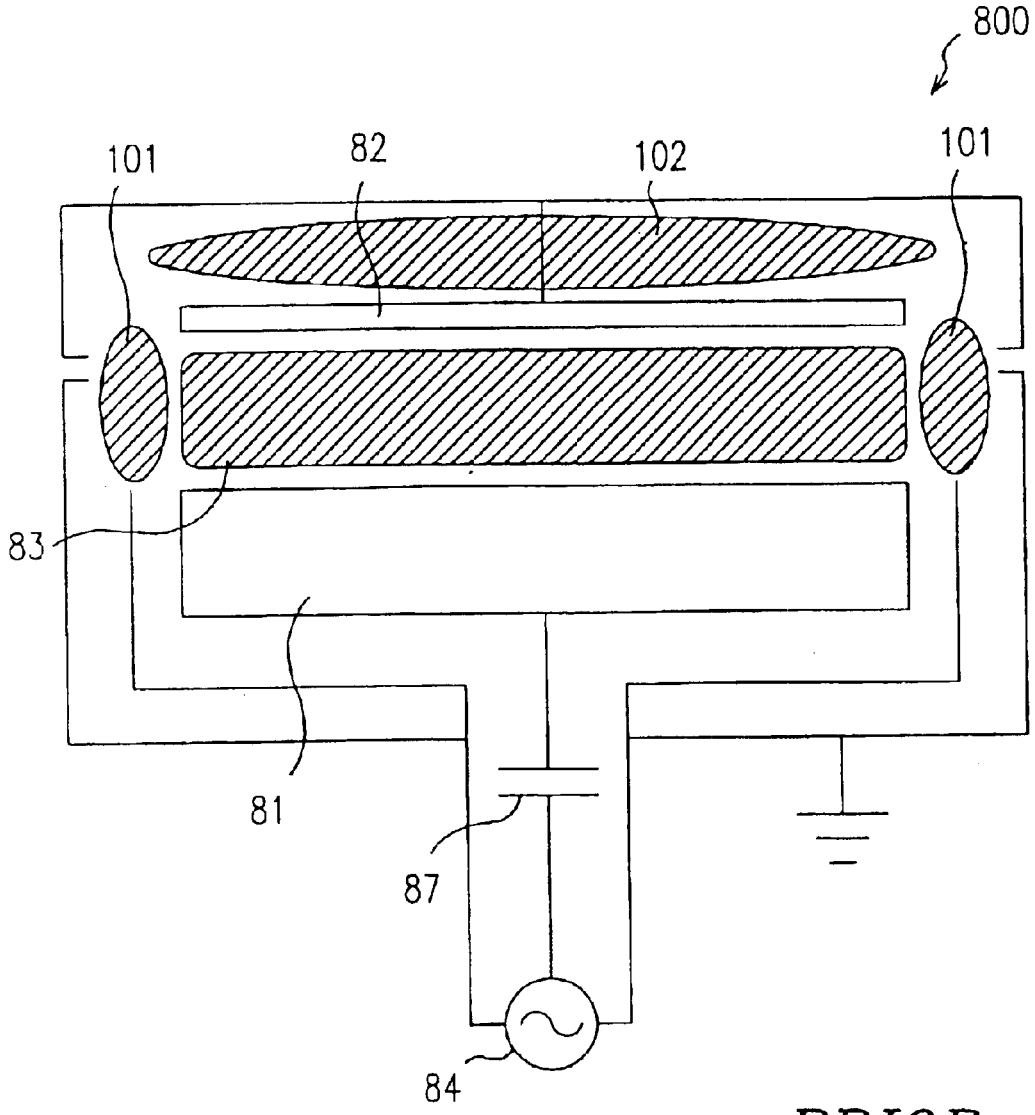
FIG. 18 is a schematic cross-sectional view for illustrating how locationally-abnormal discharge occurs in a plasma CVD apparatus.

In the conventional plasma CVD apparatus 800 as shown in FIG. 17, only the locationally-abnormal discharge occurs without normal inter-electrode discharge when the electrode length D is greater than 1/8 the wavelength λ of the high frequency voltage for excitation.

In view of this, according to the present invention, the size D of the cathode electrode is set so as to satisfy Expression (5) below.

$$D\geqq(1/8)\cdot\lambda \quad (5)$$

Thus, locationally-abnormal discharge can be suppressed. With this structure, it is also possible to realize electric discharge over a larger area and thereby to deposit a film having a larger area using a high frequency in the VHF range.

Moreover, by decreasing the value $C_C$ of the impedance adjusting capacitance component while satisfying Expression (1) above, the parallel resonance frequency $f_o$ can be raised up to the value expressed by Expression (13) below.

$$f_o=c/\lambda=c/2D_o \quad (13)$$

where $D_o$ denotes the maximum length of the reaction chamber parallel to the electrode plane λ denotes a wavelength of the high frequency voltage for excitation c denotes the velocity of light In this case, the floating capacitance equivalent $C_F$ is expressed by Expression (8) above, and as the capacitance component $C_C$ decreases, the capacitance C in Expression (12) approaches 0. Thus, the influence of the floating capacitance $C_F$ is eliminated.

Moreover, when Expression (13) above is satisfied, $D_o$ is expressed by Expression (14) below.

$$D_o=(1/2)\cdot\lambda \quad (14)$$

Herein, Expression (14) represents the condition where one standing wave exists. Thus, when $S_2$ in Expression (9) is substituted by $D_o$, it can be seen that, impedances becomes maximum, i.e., becomes physically equivalent to parallel resonance solely due to the inter-electrode region and the waveguide structure of the reaction chamber. Therefore, by setting $D_o$ so as to satisfy Expression (6) below, parallel resonance can be suppressed at any desired frequency.

$$D_o\leqq(1/2)\cdot\lambda \quad (6)$$

In view of this, according to the present invention, the maximum length $D_o$ of the reaction chamber parallel to the electrode plane is set so as to satisfy Expression (6) above.

The same applies also to the case where $L_C$ which satisfies Expression (2) above is used as an impedance adjusting element instead of the impedance adjusting capacitance component $C_C$.

When $D_o$ cannot be varied freely, it is effective to use inductance component $L_C$ which satisfies Expression (3) above. In such a case, substantially no floating capacitance $C_F$ exists whereby $L_C$ exists in parallel to $L_G$. That is, $L_C$ decreases the value $L_G$ as in Expression (15) below.

$$L=1/(1/L_G+1/L_C) \quad (15)$$

Consequently, $D_o$ in Expression (13) above is equivalently decreased.

Therefore, using $L_C$ which satisfies Expression (3) above, it is possible to avoid parallel resonance or maximization of impedance regardless of Expression (6) above which defines the upper limit of $D_o$. It is thus possible to achieve inter-electrode discharge in the range defined by Expression (7) below, which is difficult using $C_C$ or $L_C$ which satisfies Expression (2) above.

$$D_o\geqq(1/2)\cdot\lambda \quad (7)$$

In view of this, according to the present invention, the maximum length $D_o$ of the reaction chamber parallel to the electrode plane is set so as to satisfy Expression (7) above.

Moreover, employing the combination of capacitance component $C_C$ and inductance component $L_C$ which satisfies Expression (3) above, it is possible to increase the parallel resonance frequency to the value $f_o$ in Expression (13) or greater, though it depends upon the value $C_C$. It is thus possible to avoid parallel resonance or maximization of impedance in the range defined by Expression (7).

Hereinafter, illustrative examples of the electronic device manufacturing apparatus according to the present invention will be described with reference to the accompanying figures.

EXAMPLE 1

FIG. 1 illustrates an electronic device manufacturing apparatus 100 according to Example 1 of the present invention. The electronic device manufacturing apparatus 100 is implemented as a plasma CVD apparatus. The apparatus 100 includes a reaction chamber 6 which has a rectangular cross section. The anode electrode 2, the upper cathode electrode 1a and the lower cathode electrode 1b are provided within the reaction chamber 6. A bottom wall 60 of the reaction chamber 6 is grounded at some location in the right (in the figure) half thereof. The anode electrode 2 is electrically connected to an upper wall 61 of the reaction chamber 6, so as to be grounded.

The bottom wall 60 includes an opening in the middle of its length. The opening is insulated from the wall of the reaction chamber 6. A high frequency power generation source 4 is provided below the opening. The DC blocking capacitance element 7 ($C_B$) formed of a capacitor is connected in series between the high frequency power generation source 4 and the lower cathode electrode 1b. A gas inlet 5 is provided through a side wall 62 of the reaction chamber 6 at some location slightly toward the upper end from the vertical midpoint of the side wall 62. A material gas is introduced into the reaction chamber 6 through the gas inlet 5.

In addition, in the electronic device manufacturing apparatus 100, the impedance adjusting capacitance formed by a capacitor 10 is connected in series between the upper cathode electrode 1a and the lower cathode electrode 1b. A reaction region 3 is defined between the anode electrode 2 and the upper cathode electrode 1a. A substrate on which a thin film is to be deposited is inserted into the reaction region 3.

Herein, the size of the reaction region 3 (or the apparatus size) is about 1.6 m×1.6 m (as the cross-sectional area of the reaction region 3 in parallel to the plane of the electrode). The respective area of the cathode electrode 1a and the anode electrode 2 are about 700 mm by 700 mm. The value $C_F$ of the floating capacitance formed between the lower cathode electrode 1b and the bottom wall 60 of the reaction chamber 6 is about 800 pF.

As a material gas, a mixed gas of silane and hydrogen is used. The high frequency power generation source 4 includes a high frequency power source and a matching circuit (not shown), while a series variable capacitor (20 to 1000 pF) in the matching circuit is used as the capacitor 7 which forms the DC blocking capacitance element $C_B$.

Figure 20:
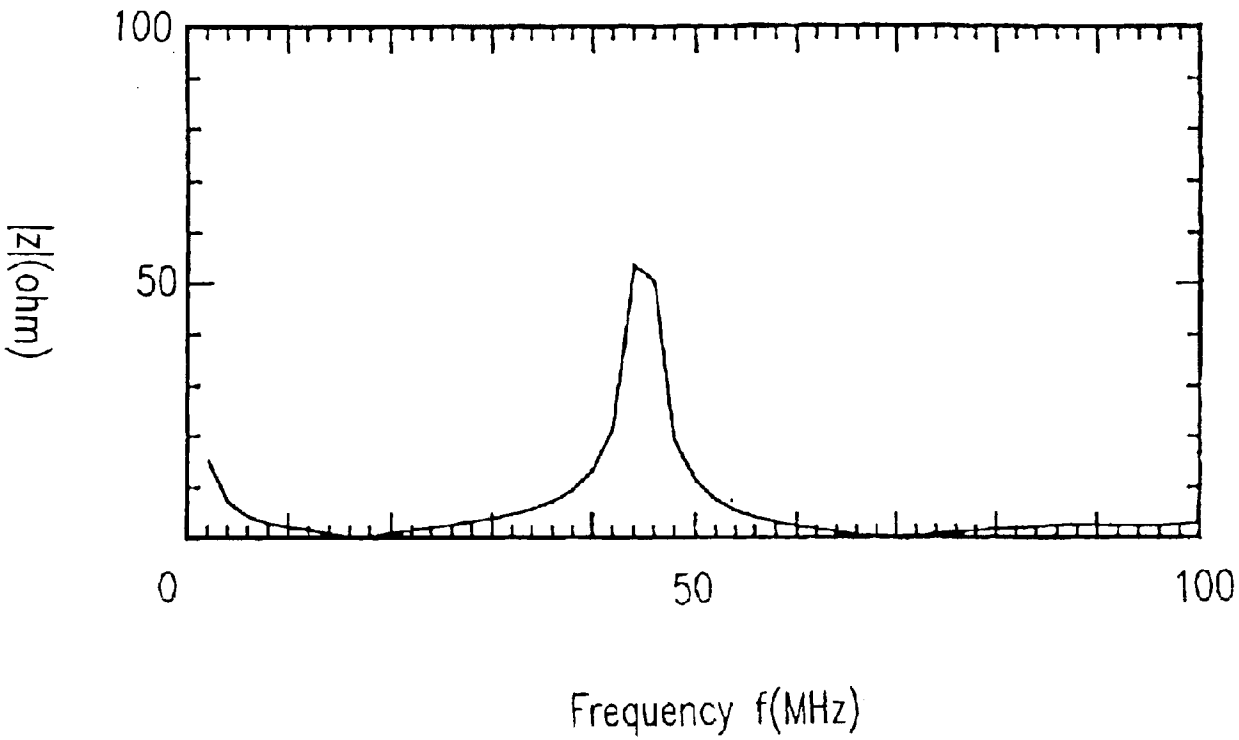
FIG. 20 is a graph illustrating the frequency dependency of the magnitude |Z| of impedance between a cathode electrode and an anode electrode in the conventional plasma CVD apparatus shown in FIG. 17.

Next, advantages of the plasma CVD apparatus 100 according to Example 1 of the present invention over the conventional apparatus 800 shown in FIG. 17 will be described. FIG. 20 shows the frequency dependency of the magnitude |Z| of the impedance between the cathode electrode 81 and the anode electrode 82 of the conventional apparatus 800 shown in FIG. 17. As can be seen from FIG. 20, parallel resonance is observed at the frequency f of about 45 MHz in this conventional apparatus 800. When a high frequency power was actually introduced into the apparatus from the frequency-variable high frequency power generation source 84, normal plasma generation between the electrodes 81 and 82 occurred only in the frequency range of about 10 to 35 MHz. In this case, the impedance component equivalent $L_G$ in the reaction regions 83 is about 0.025 μH as can be known from Expression (9).

Figure 2:
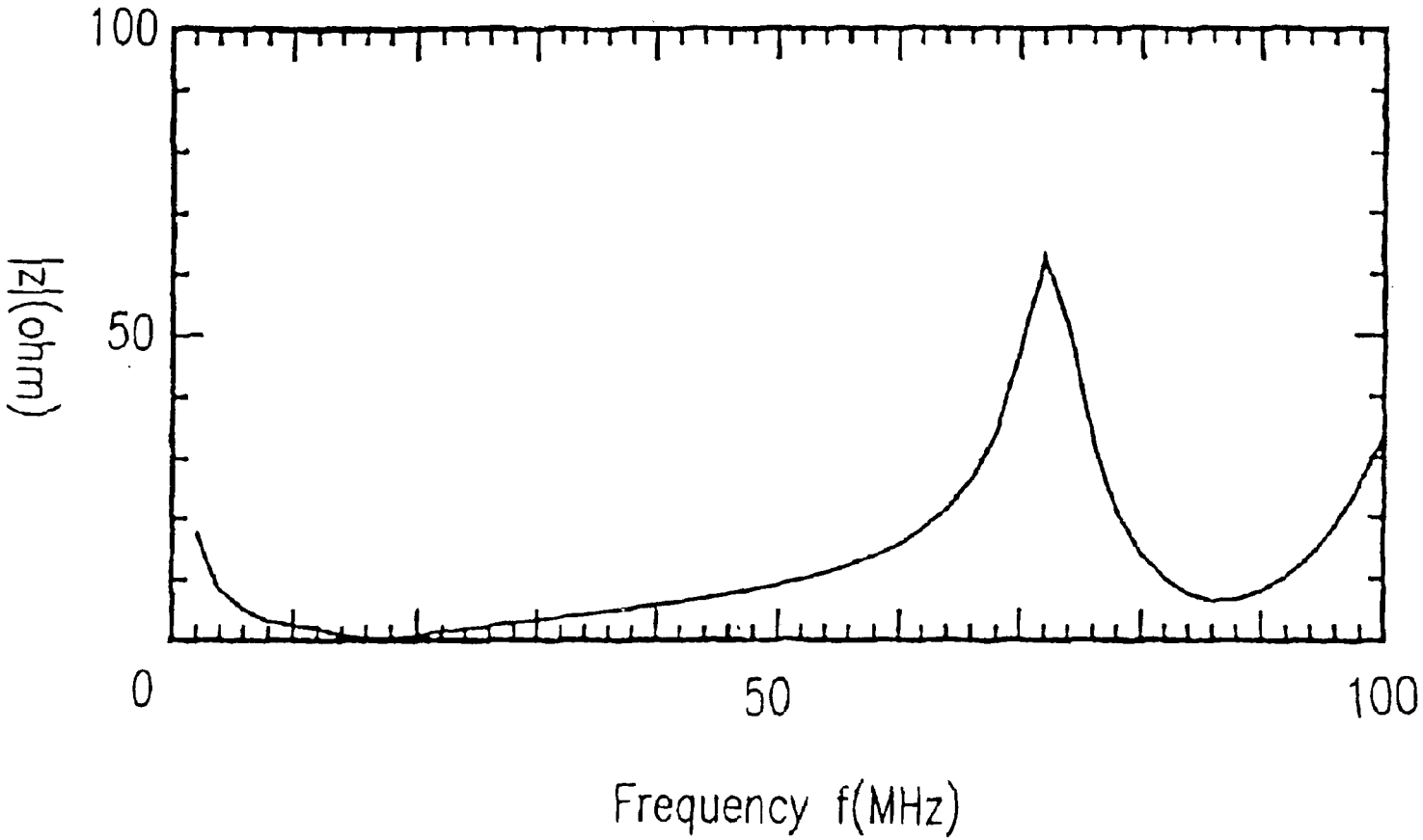
FIG. 2 is a graph illustrating the frequency dependency of the magnitude |Z| of impedance between a cathode electrode and an anode electrode in the plasma CVD apparatus of Example 1.

On the other hand, when the impedance adjusting capacitor 10 ($C_C$=100 pF, which satisfies Expression (1) above) was inserted below the cathode electrode 1a as in the plasma. CVD apparatus 100 according to Example 1 of the present invention, the magnitude |Z| of the impedance varied as shown in FIG. 2. It can be seen from FIG. 2 that the parallel resonance frequency $f_o$ of the lowest order is raised up to about 72 MHz.

In fact, the parallel resonance frequency $f_o$ of the lowest order can easily be set to be outside the range of 40 to 100 MHz by suitably setting the value $C_C$ of the impedance adjusting capacitance $C_C$.

As can also be seen from FIG. 2, there is substantially no impedance variation in the RF range (around 10 MHz). Accordingly, it can be understood that the insertion of the impedance adjusting capacitor 10 ($C_C$) has substantially no influence on high frequencies in the RF range. When the impedance between the electrodes 1a and 2 was actually controlled as described above, plasma generation between the electrodes 1a and 2 was achieved over frequencies of about 10 to 62 MHz.

As described above, in the plasma CVD apparatus 100 according to Example 1 of the present invention, the parallel resonance frequency $f_o$ can easily be set to exceed the frequency range of the high frequency for excitation. Therefore, any frequency from the RF range to the VHF range may be used for excitation.

Thus, according to Example 1 of the present invention, it is possible to generate plasma by using a parallel-plate large-scale manufacturing apparatus (plasma CVD apparatus) including electrodes each about 1 m-by-1 m large with any frequency in a wide range of frequencies from the RF range to the VHF range. Thus, in manufacturing solar batteries for power supply, liquid crystal display device, etc., higher excitation frequencies can be used for generating an electromagnetic field and deposition can be achieved over a larger area substrate.

According to Example 1, the present invention is applied to a plasma CVD apparatus which includes the DC blocking capacitance element $C_B$ in the form of a capacitor 7. However, the present invention can similarly be applied to a plasma CVD apparatus which does not have such a DC blocking capacitance element. In such a case, the impedance adjusting capacitor 10 having capacitance value $C_C$ can be inserted between the cathode electrode 1a and the high frequency power generation source 4.

Although the case where the electronic device manufacturing apparatus of the present invention is implemented as a plasma CVD apparatus has been described, it can similarly be implemented as a plasma dry etching (asher) apparatus for etching a film, which operates based on a principle that plasma particles and active species generated by plasma excitation can be used to etch a film. Similar effects as described above can also be realized in such an implementation.

EXAMPLE 2

Figure 4:
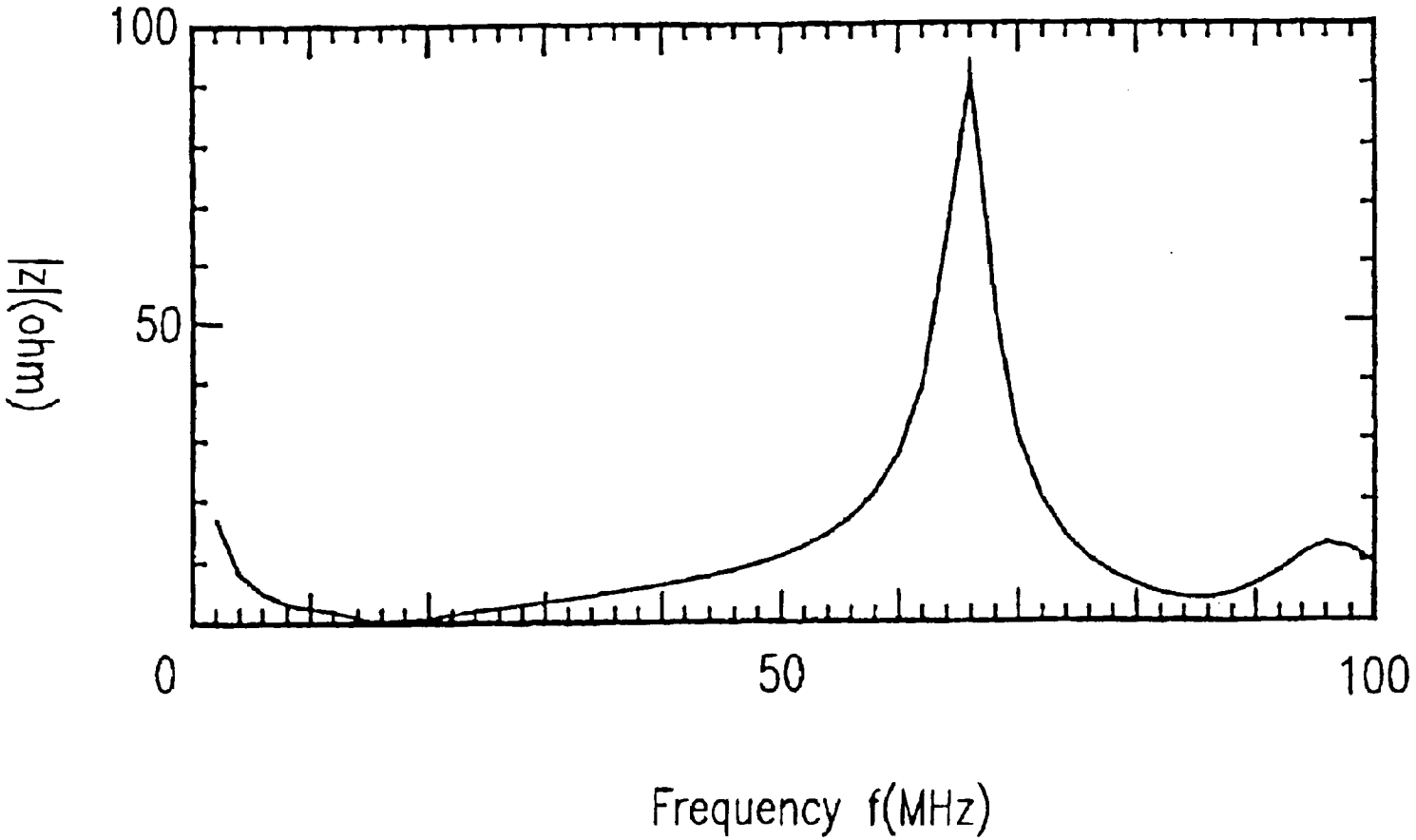
FIG. 4 is a graph illustrating the frequency dependency of the magnitude |Z| of impedance between a cathode electrode and an anode electrode in the plasma CVD apparatus of Example 2.

FIGS. 3 and 4 are provided for illustrating an electronic device manufacturing apparatus 200 according to Example 2 of the present invention. The electronic device manufacturing apparatus 200 of Example 2 is also implemented as a plasma CVD apparatus. The difference from Example 1 is in the element that serves as the impedance adjusting capacitor having capacitance value $C_C$. In Example 1, a capacitor is inserted to form the impedance adjusting capacitance $C_C$. In Example 2, as shown in FIG. 3, a dielectric 11 (e.g., having a thickness of about 50 mm and a relative dielectric constant of about 3.0) is inserted to form the impedance adjusting capacitance $C_C$ between the cathode electrodes 1a and 1b. Components of the apparatus 200 of Example 2 shown in FIG. 3 which are also provided in the apparatus 100 of Example 1 are denoted by the same reference numerals and will not be described in detail below.

FIG. 4 shows the frequency dependency of the magnitude |Z| of the impedance between the cathode electrode 1a and the anode electrode 2 in the plasma CVD apparatus 200 according to Example 2 of the present invention. As can be seen from FIG. 4, the parallel resonance frequency $f_o$ is raised up to about 66 MHz, and plasma generation between the electrodes 1a and 2 is achieved over frequencies of about 10 to 55 MHz.

Thus, similar effects as in Example 1 can also be realized in the plasma CVD apparatus 200 according to Example 2 of the present invention. In addition, there is another advantage to Example 2, it can also be applied to an apparatus in which there is not a sufficient amount of space around the cathode electrode 1 for a capacitor to be inserted therein.

EXAMPLE 3

Figure 5:
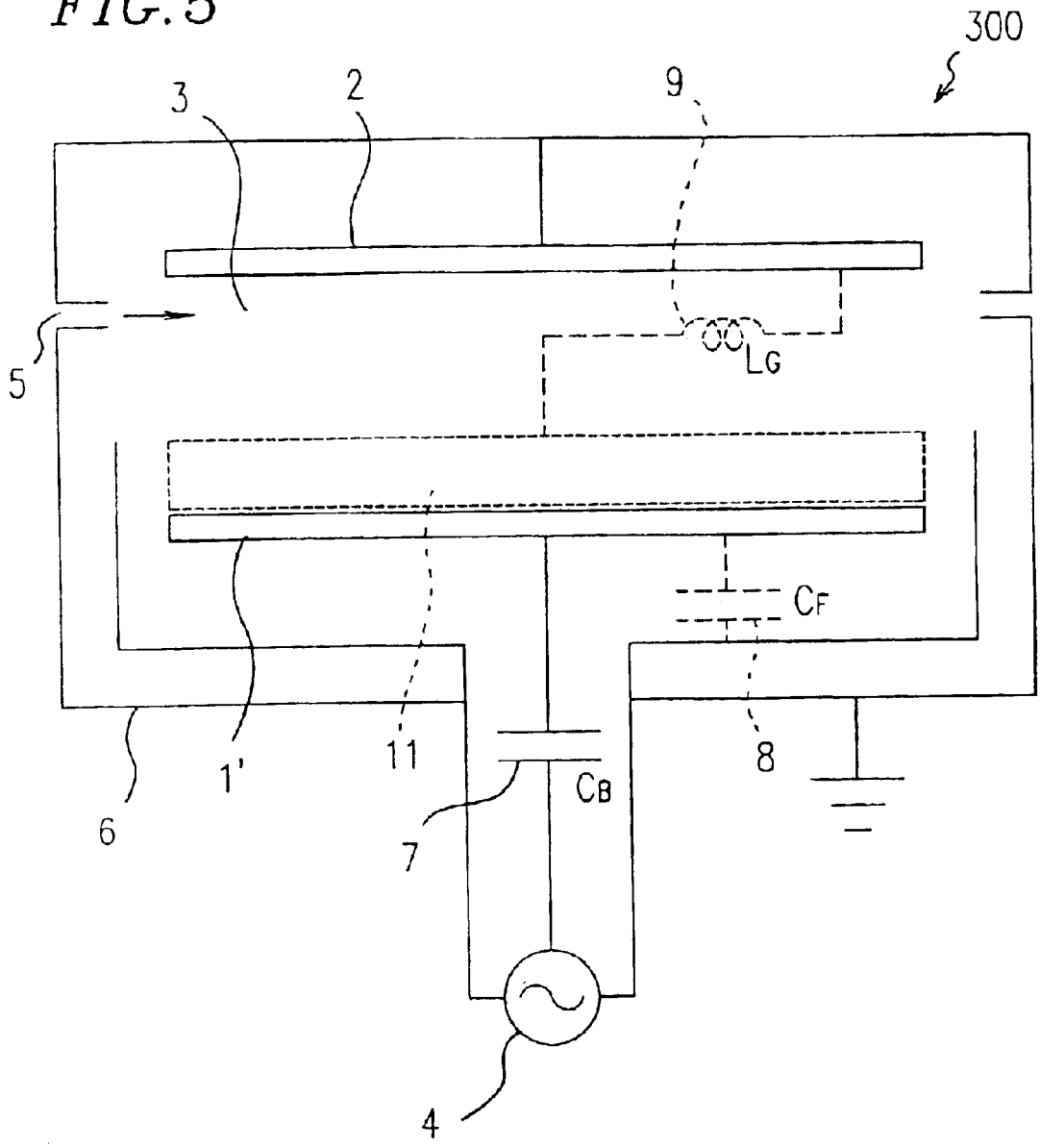
FIG. 5 is a schematic cross-sectional view illustrating Example 3 of the present invention, where the electronic device manufacturing apparatus of the present invention is implemented as a plasma CVD apparatus.

FIG. 5 illustrates an electronic device manufacturing apparatus 300 according to Example 3 of the present invention. The electronic device manufacturing apparatus 300 of Example 3 is also implemented as a plasma CVD apparatus. The difference from Examples 1 and 2 is as follows. In Example 3, as shown in FIG. 5, the dielectric 11 is provided on the cathode electrode 11 so as to form the impedance adjusting capacitor 11 having a capacitance value $C_C$, while the electrode corresponding to the upper cathode electrode 1a, as in Examples 1 and 2, is eliminated. Components of the apparatus 300 of Example 3 shown in FIG. 5 which are also provided in the apparatuses of Examples 1 and 2 are denoted by the same reference numerals.

Herein, the dielectric 11 is formed of teflon having a relative dielectric constant of about 2.0 and a thickness of about 35 mm, and provides an impedance adjusting capacitance $C_C$ of about 250 pF.

In this structure, electrons in the plasma generated in the reaction region 3 are drawn onto the surface of the dielectric 11, so that the surface of the dielectric 11 is charged. Thus, the surface of the dielectric 11 which faces the reaction region 3 functions similarly as the upper cathode electrode 1a of Example 2.

Moreover, when depositing an a-Si:H thin film or the like using a material gas such as silane, a film is also deposited on the surface of the dielectric 11. Since the film deposited on the dielectric 11 has some conductivity, the film also functions similarly as the upper cathode electrode 1a of Example 2.

As the material of the dielectric 11 which forms the impedance adjusting capacitance $C_C$, quartz glass (e.g., having a thickness of about 70 mm and a relative dielectric constant of about 4.0) or ceramic (e.g., alumina having a thickness of about 175 mm and a relative dielectric constant of about 10.0) may also be used. It has been confirmed that similar effects can also be realized using these materials.

In the plasma CVD apparatus 300 according to Example 3, the magnitude $|Z|$ of the impedance between the cathode electrode 1' and the anode electrode 2 exhibits substantially the same frequency dependency as that described in Example 2 and shown in FIG. 4. This is because the capacitance of the dielectric (i.e., impedance adjusting capacitance $C_C$) 11 used in Example 3 is substantially the same as that used in Example 2.

However, thickness distribution in the thin film deposited on the glass substrate placed on the surface of the anode electrode 2 was measured to be as large as about ±8% in Example 3, while it was about ±4% in Example 2. This may be due to the fact that, in Example 3, the conductivity of the upper surface of the dielectric 11 is relatively low compared to that of the upper cathode electrode.

As compared to the plasma CVD apparatus 200 of Example 2, the plasma CVD apparatus 300 of Example 3 has an advantage of having a relatively simple apparatus structure, but has a disadvantage of having a larger thickness distribution in the surface of the deposited film. In view of this, the plasma CVD apparatus 300 of Example 3 is effective particularly when film deposition is performed with a number of substrates each having a small area being placed on the surface of the anode electrode 2.

EXAMPLE 4

Figure 6:
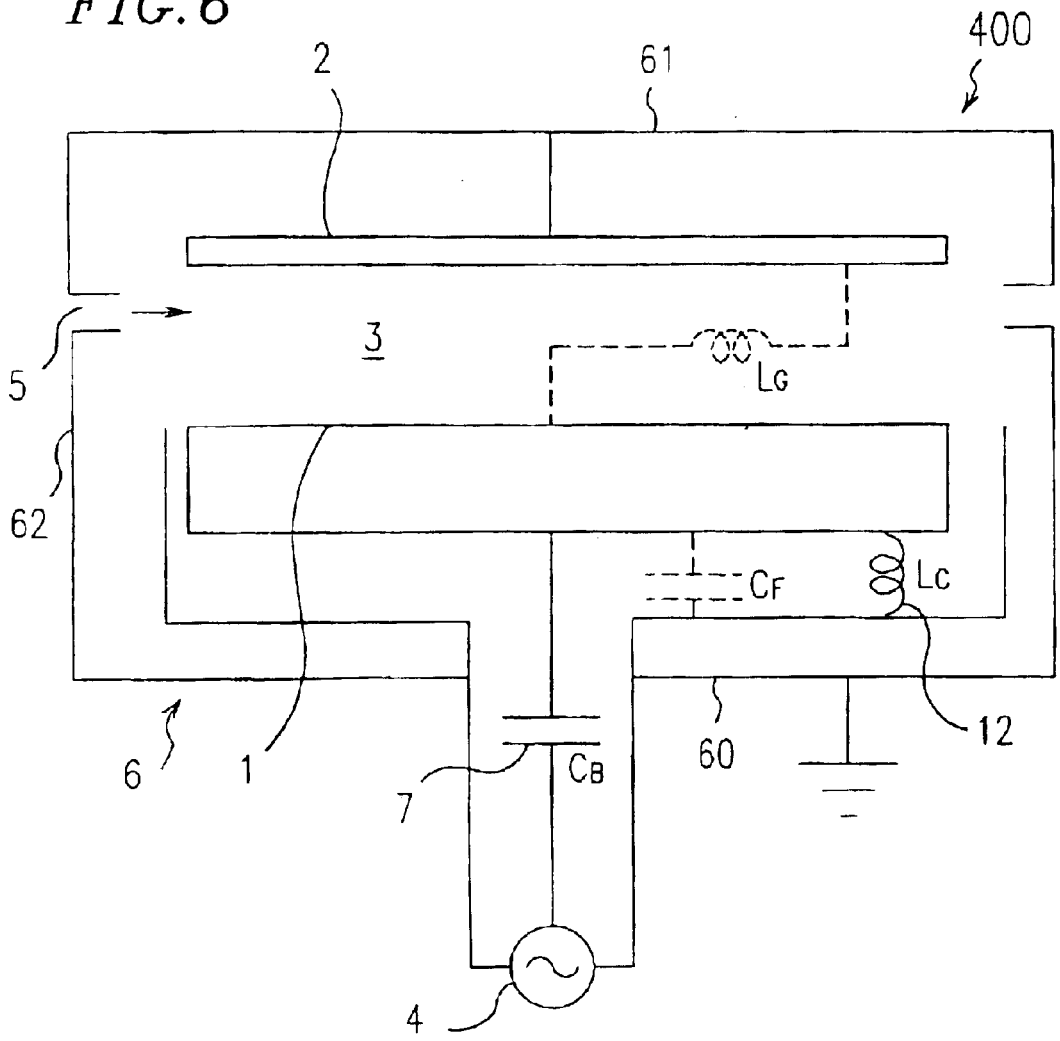
FIG. 6 is a schematic cross-sectional view illustrating Example 4 of the present invention, where the electronic device manufacturing apparatus of the present invention is implemented as a plasma CVD apparatus.
Figure 7:
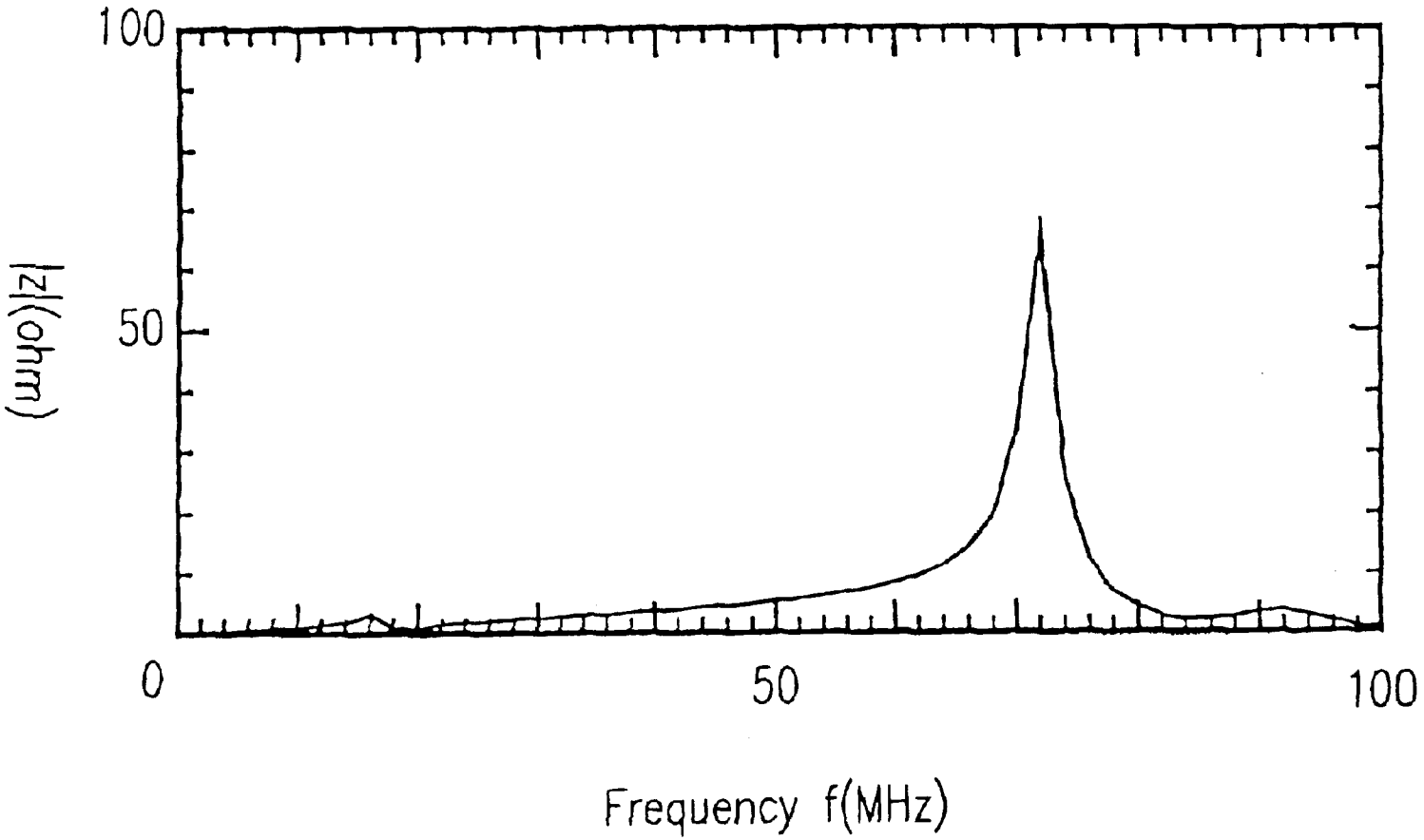
FIG. 7 is a graph illustrating the frequency dependency of the magnitude |Z| of impedance between a cathode electrode and an anode electrode in the plasma CVD apparatus of Example 4.

FIGS. 6 and 7 are provided for illustrating an electronic device manufacturing apparatus 400 according to Example 4 of the present invention. The electronic device manufacturing apparatus 400 of Example 4 is also implemented as a plasma CVD apparatus. The difference from Examples 1 to 3 is as follows. In Example 4, the impedance adjusting inductor 12 having an inductance value $L_C$ formed of a coil is inserted under the cathode electrode 1 in parallel to the floating capacitance $C_F$ of the cathode electrode 1 as shown in FIG. 6.

Herein, the value $L_C$ of the impedance adjusting inductor 12 is set to about 0.007 μH, which satisfies Expression (2) above. Components of the apparatus 400 of Example 4 shown in FIG. 6 which are also provided in the apparatuses of Examples 1 and 2 are denoted by the same reference numerals.

FIG. 7 shows the frequency dependency of the magnitude $|Z|$ of the impedance between the cathode electrode 1 and the anode electrode 2 in the plasma CVD apparatus 400 according to Example 4 of the present invention. As can be seen from FIG. 7, the parallel resonance frequency $f_o$ is raised up to about 72 MHz, and plasma generation between the electrodes 1 and 2 is achieved over frequencies of about 10 to 66 MHz.

Thus, similar effects as in Example 1 can also be realized in the plasma CVD apparatus 400 according to Example 4 of the present invention.

Although, in Example 4, a coil is used to form the impedance adjusting inductance $L_C$, the parallel resonance frequency $f_o$ can also be controlled by a measure other than providing a coil. For example, it can be achieved by short-circuiting the cathode electrode 1 to the ground level for a DC voltage using a copper plate or the like. This is possible because, for high frequency voltages, such short-circuiting is equivalent to inserting the impedance adjusting inductor 12 having an inductance value $L_C$.

Example 4 is advantageous particularly when there is not a sufficient amount of space around the cathode electrode 1 for a coil to be inserted therein.

EXAMPLE 5

Figure 8:
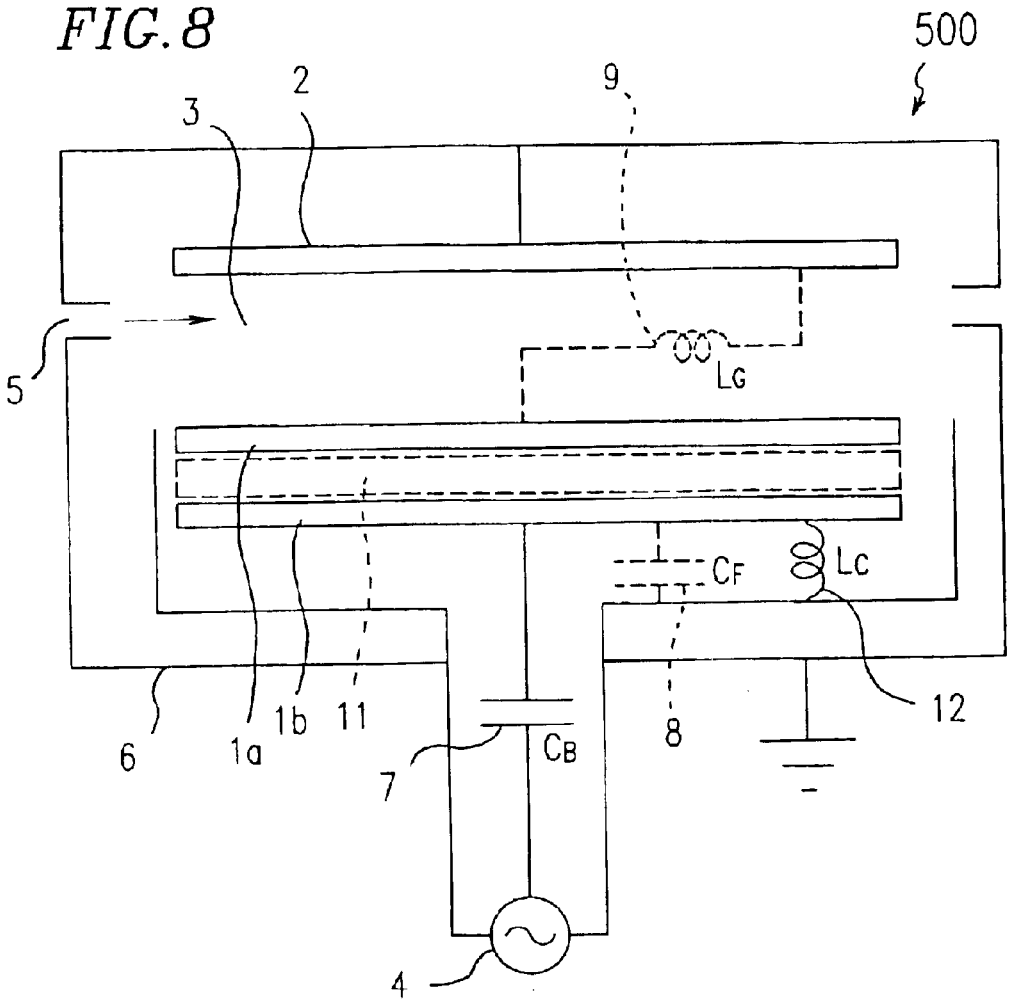
FIG. 8 is a schematic cross-sectional view illustrating Example 5 of the present invention, where the electronic device manufacturing apparatus of the present invention is implemented as a plasma CVD apparatus.
Figure 9:
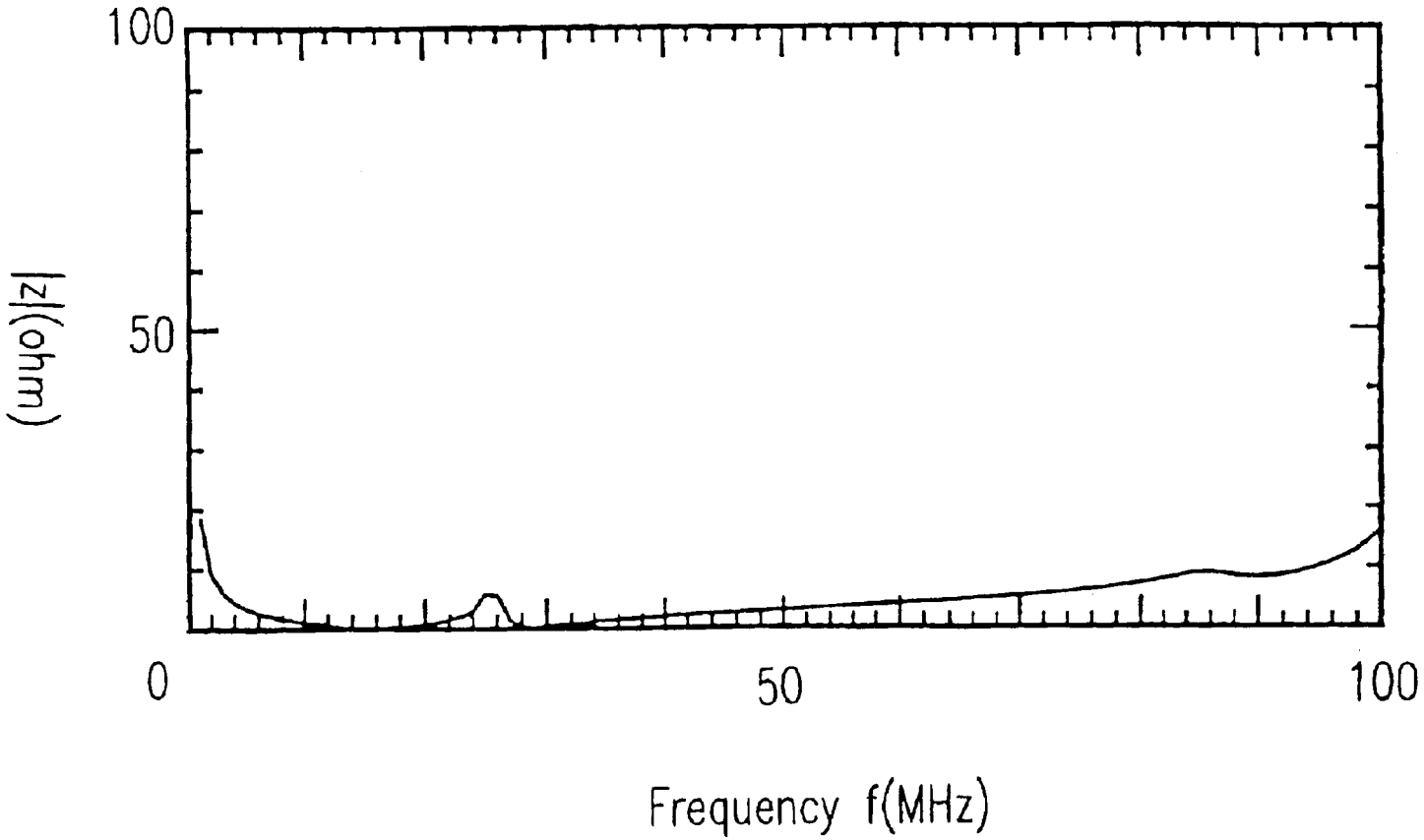
FIG. 9 is a graph illustrating the frequency dependency of the magnitude |Z| of impedance between a cathode electrode and an anode electrode in the plasma CVD apparatus of Example 5.

FIGS. 8 and 9 are provided for illustrating an electronic device manufacturing apparatus 500 according to Example 5 of the present invention. The electronic device manufacturing apparatus 500 of Example 5 is also implemented as a plasma CVD apparatus. The difference from Examples 1 to 4 is as follows. In Example 5, as shown in FIG. 8, the dielectric 11 is inserted between the cathode electrodes 1a and 1b so as to form the impedance adjusting capacitance $C_C$. Moreover, the impedance adjusting inductance $L_C$ formed by a coil 12 is inserted under the cathode electrode 1b in parallel to the floating capacitance $C_F$ of the cathode electrode 1b. Thus, Example 5 is a combination of Examples 2 and 4. Components of the apparatus 500 of Example 5 shown in FIG. 8 which are also provided in the apparatuses of Examples 2 and 4 are denoted by the same reference numerals.

In such a structure, the dielectric 11 is formed of teflon, for example, having a relative dielectric constant of about 2.0 and a thickness of about 2 mm. The coil 12 is formed of a plurality of coil-shaped copper plates.

Herein, the impedance adjusting capacitance $C_C$ and the impedance adjusting inductance $L_C$ are about 4200 pF and about 0.003 μH, respectively. The value $L_C$ satisfies either Expression (2) or Expression (3) according to the frequency used.

As the material of the dielectric 11 which forms the impedance adjusting capacitance $C_C$, quartz glass (e.g., having a thickness of about 4 mm and a relative dielectric constant of about 4.0) or ceramic (e.g., alumina having a thickness of about 10 mm and a relatively dielectric constant of about 10.0) may also be used. It has been confirmed that similar effects can also be realized with these materials.

FIG. 9 shows the frequency dependency of the magnitude |Z| of the impedance between the cathode electrode 1a and the anode electrode 2 in the plasma CVD apparatus 500 according to Example 5 of the present invention. As can be seen from FIG. 9, the parallel resonance frequency $f_o$ is raised to exceed 100 MHz, and plasma generation between the cathode electrode 1a and the anode electrode 2 is achieved over frequencies of about 10 to 94 MHz. Thus, it has been confirmed that inter-electrode discharge can be achieved in the range (frequency>54 MHz) defined by Expression (5) in which normal inter-electrode discharge cannot be achieved with a conventional plasma CVD apparatus of the same size. The reason for this was described above.

Using the plasma CVD apparatus 500 of Example 5, an a-Si:H thin film was actually deposited to be about 1 mm on a glass substrate having an area about 50 cm×50 cm placed on the surface of the anode electrode 2. The frequency was fixed at about 81.36 MHz. Silane and hydrogen as reaction gases were introduced through the gas inlet 5 at flow rates of about 300 sccm and about 500 sccm, respectively, with the pressure within the reaction region 3 being kept at about 0.3 Torr.

As plasma generation between the cathode electrode 1a and the anode electrode 2 was achieved in the apparatus 500 of Example 5, it has become possible to increase the deposition rate by increasing the frequency in large-scale apparatuses. Such an effect of increasing the deposition rate has only been conventionally realized in small-scale apparatuses. Table 1 below shows the resultant thin film parameters.

TABLE 1

| Frequency condition | continuous discharge at 81 MHz (300 W) | pulse discharge at 81 MHz (300 W) | continuous discharge at 13.56 MHz (300 W) |
|---|---|---|---|
| Deposition rate | 90 nm/min | 65 nm/min | 6 nm/min |
| Defact density in the film | $5 \times 10^{14}$ cm$^{-3}$ | $4 \times 10^{14}$ cm$^{-3}$ | $5 \times 10^{15}$ cm$^{-3}$ |
| Si—$H_2$ binding amount in the film | 4% | 1% | 3% |

For an a-Si:H thin film solar battery, a lower defect density and/or less Si-$H_2$ binding amount in the film indicates a higher quality the thin film.

The plasma CVD apparatus 500 of Example 5 was examined by setting the high frequency power generation source 4 to two exemplary high frequency conditions, i.e., continuous discharge at a frequency of about 81 MHz and pulse discharge at a frequency of about 81 MHz as shown in Table 1. The results for a conventional device shown in Table 1 for comparison were obtained for continuous discharge at a frequency of about 13.56 MHz.

For continuous discharge at a high frequency power of about 300 W in the apparatus 500 of Example 5, the deposition rate was about 90 nm/min, and the defect density in the film was about $5\times10^{14}$cm$^{-3}$. This indicates an increase of about 15-fold in the deposition rate and a reduction of about 10-fold in the defect density in the film with respect to the conventional apparatus.

For pulse discharge at a time-averaged high frequency power of about 300 W with a pulse ON time being about 5 μsec, and a pulse OFF time being about 50 μsec, the deposition rate was about 65 nm/min, the defect density in the film was about $4\times10^{14}$cm$^{-3}$, and the Si-$H_2$ binding amount in the film was about 1%. This indicates an increase of about 11-fold in the deposition rate and a reduction of about 3-fold in the Si-$H_2$ binding amount in the film with respect to the conventional apparatus. Thus, the plasma CVD apparatus 500 of Example 5 can produce a high-quality thin film on a large-area substrate at a higher deposition rate.

In the above description, the electronic device manufacturing apparatus 500 of Example 5 is implemented as a plasma CVD apparatus. However, such apparatus can also be implemented as a plasma dry etching (asher) apparatus which utilizes VHF discharge. Such an etching (asher) apparatus is operated by introducing an etching gas, such as $CCl_4$, as a reaction gas and can process large area film.

EXAMPLE 6

Figure 10:
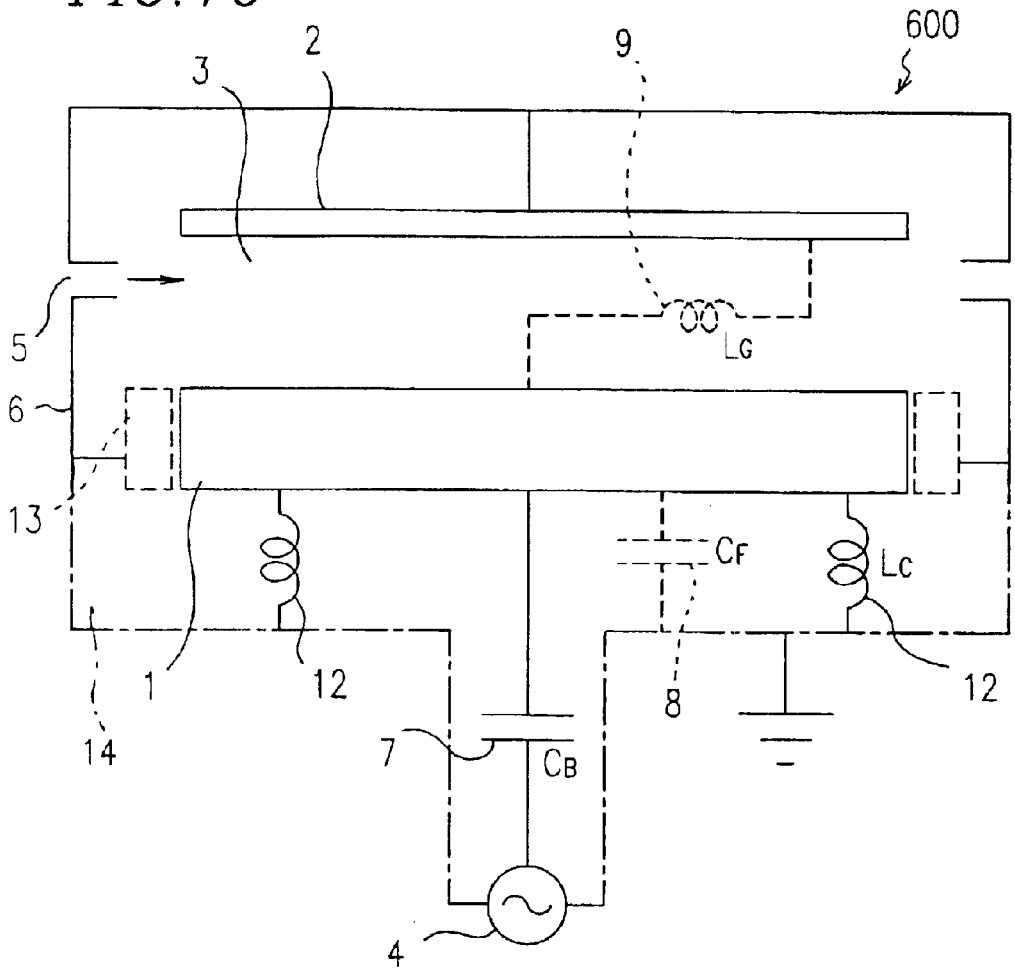
FIG. 10 is a schematic cross-sectional view illustrating Example 6 of the present invention, where the electronic device manufacturing apparatus of the present invention is implemented as a plasma CVD apparatus.
Figure 11:
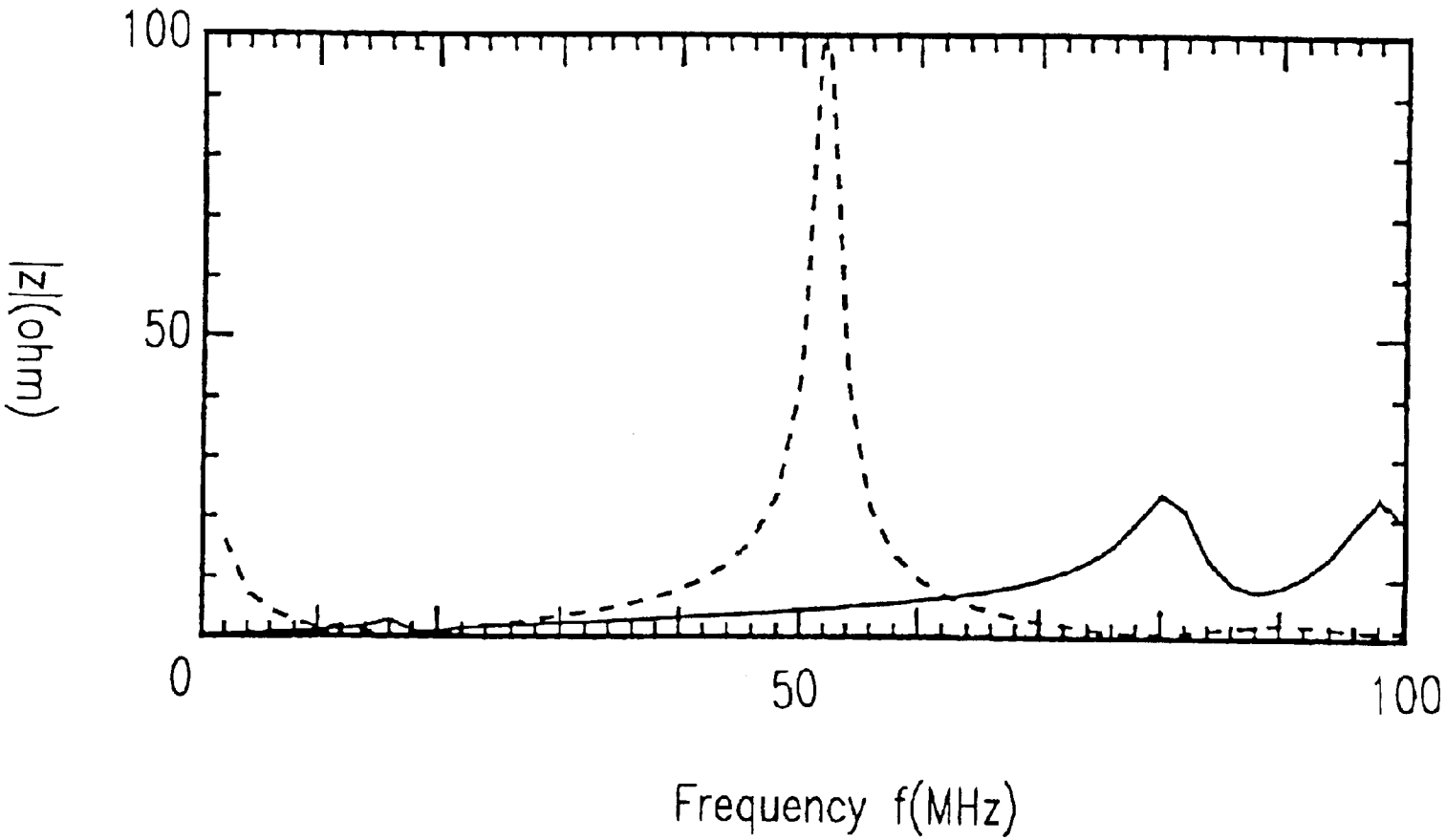
FIG. 11 is a graph illustrating the frequency dependency of the magnitude |Z| of impedance between a cathode electrode and an anode electrode in the plasma CVD apparatus of Example 6.

FIGS. 10 and 11 are provided for illustrating an electronic device manufacturing apparatus 600 according to Example 6 of the present invention. The electronic device manufacturing apparatus 600 of Example 6 is also implemented as a plasma CVD apparatus. The difference from Examples 1 to 5 is as follows. The electronic device manufacturing apparatus of any one of Examples 1 to 5 is of an internal type, where the cathode electrode 1 is entirely provided inside the reaction chamber 6. On the other hand, the electronic device manufacturing apparatus 600 of Example 6 is of an external type, where the bottom wall of the reaction chamber 6 is formed by the cathode electrode 1 and electrode-side dielectrics (side dielectrics provided on the outer side of the electrode) 13 as shown in FIG. 10. Components of the apparatus 600 of Example 6 shown in FIG. 10 which are also provided in the apparatuses of Examples 1 to 5 are denoted by the same reference numerals.

In the external-type structure, a region 14 below the cathode electrode 1 does not need to be airtightly sealed. With such a structure, the region 14 can easily be opened so that the impedance adjusting inductance $L_C$ formed by a coil 12 (impedance adjusting inductor 12) can be provided under the cathode electrode 1. The inductance value $L_C$ can easily be adapted to the frequency used as required.

In this example, the coil 12 is formed of a plurality of coil-shaped copper plates, and the impedance adjusting inductance $L_C$ thereof is about 0.007 μH. The dashed line in FIG. 11 represents the frequency dependency of the magnitude |Z| of the impedance between the cathode electrode 1 and the anode electrode 2 in a plasma CVD apparatus where the impedance adjusting inductor 12 is not provided. On the other hand, the solid line in FIG. 11 represents the frequency dependency of the magnitude |Z| in Example 6 where the impedance adjusting inductor 12 is provided.

As can be seen from FIG. 11, the parallel resonance frequency $f_o$, which is about 52 MHz without the impedance adjusting inductor 12, is raised up to about 80 MHz by providing the impedance adjusting inductor 12, whereby plasma generation between the electrodes 1 and 2 can be achieved over frequencies of about 10 to 76 MHz.

EXAMPLE 7

Figure 12A:
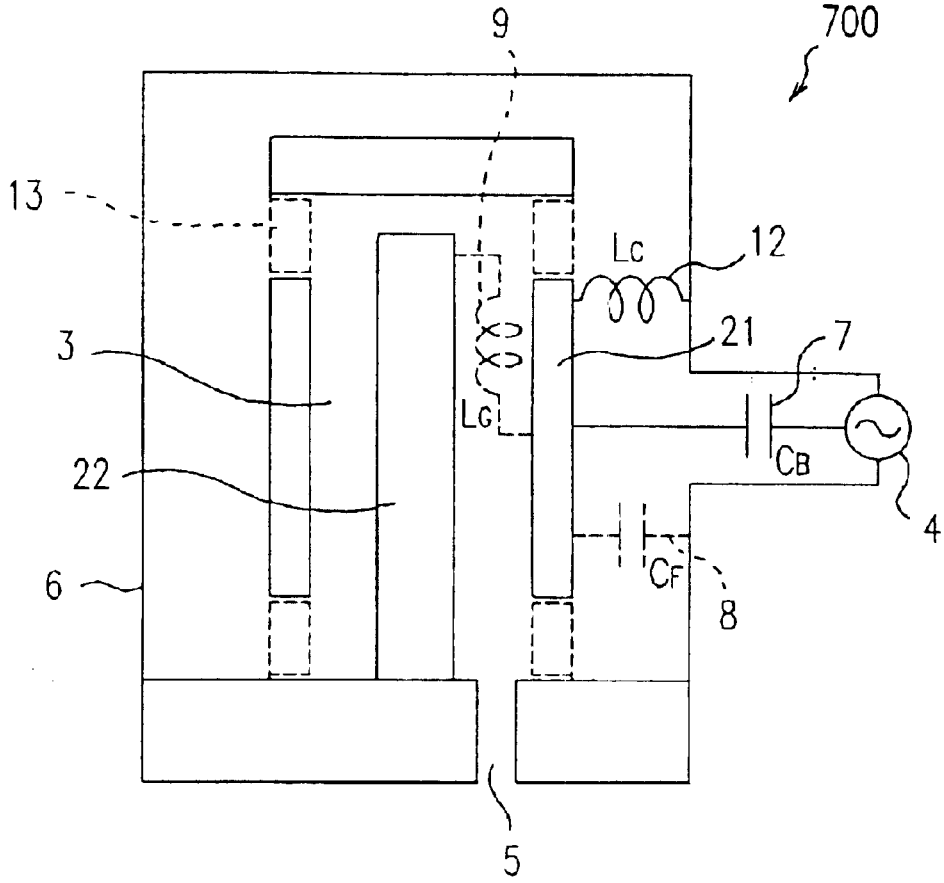
FIG. 12A is a schematic cross-sectional view illustrating Example 7 of the present invention, where the electronic device manufacturing apparatus of the present invention is implemented as a plasma CVD apparatus.
Figure 12B:
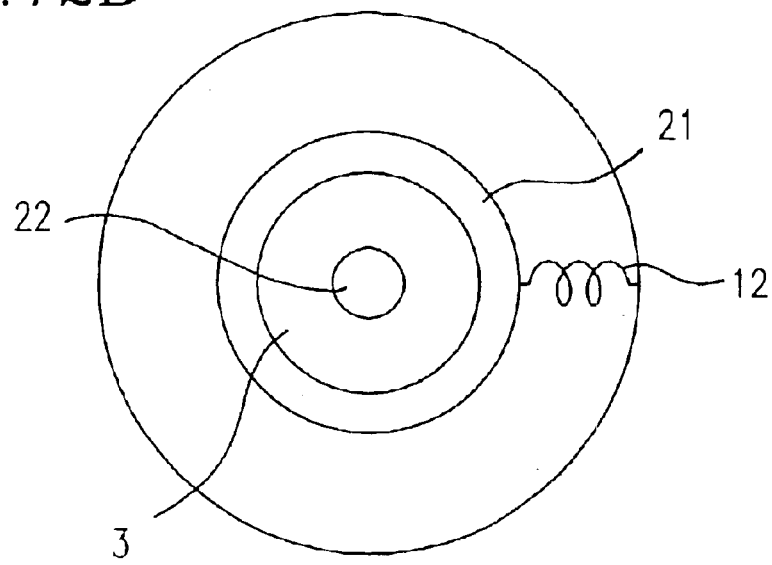
FIG. 12B is a schematic plan view illustrating the electrode structure in the apparatus of Example 7.
Figure 13:
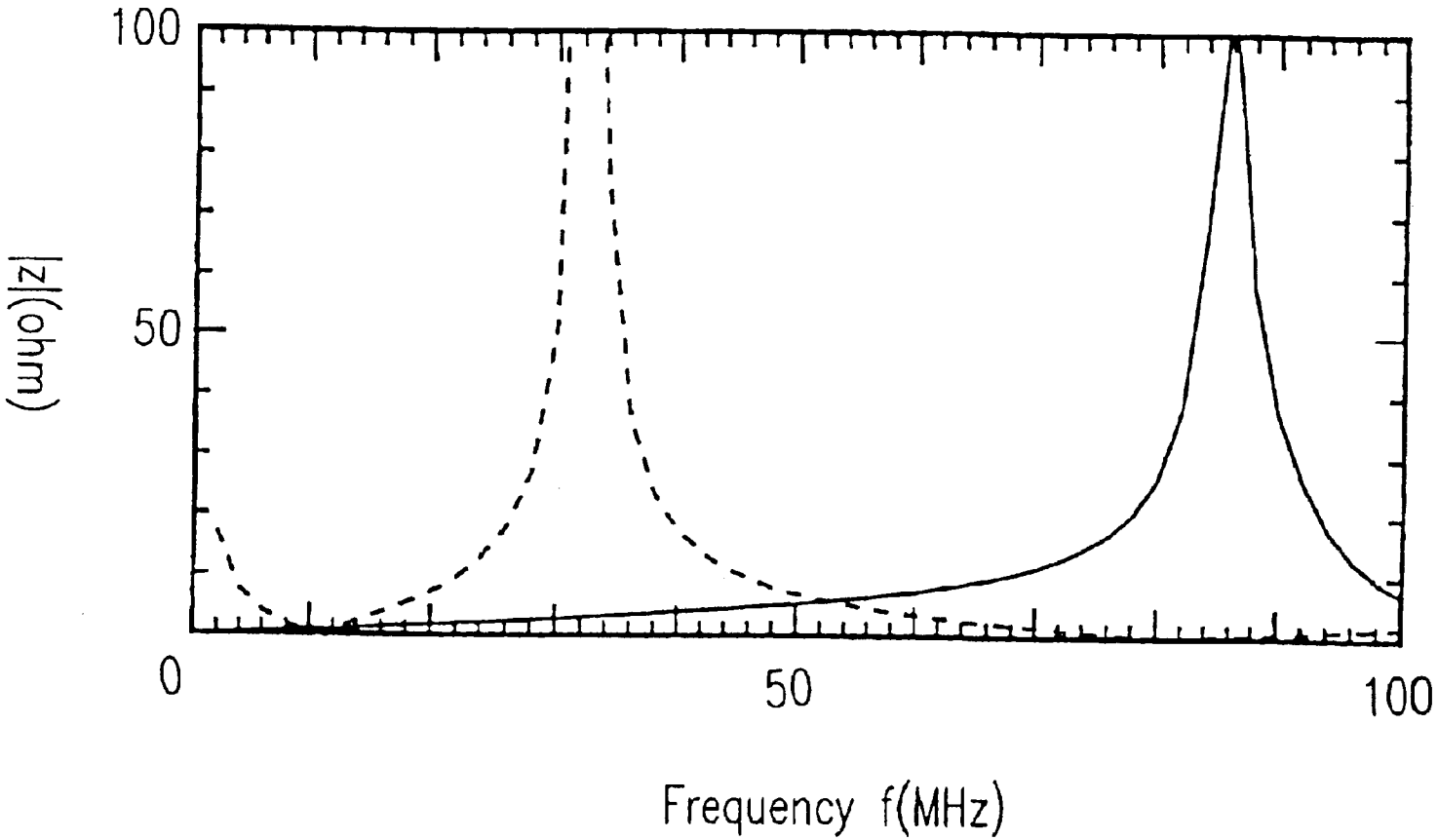
FIG. 13 is a graph illustrating the frequency dependency of the magnitude |Z| of impedance between a cathode electrode and an anode electrode in the plasma CVD apparatus of Example 7.

FIGS. 12A, 12B and 13 are provided for illustrating an electronic device manufacturing apparatus 700 according to Example 7 of the present invention. The electronic device manufacturing apparatus 700 of Example 7 is also implemented as a plasma CVD apparatus. The difference from Examples 1 to 6 is as follows. The plasma CVD apparatus of any one of Examples 1 to 6 includes parallel-plate electrodes. On the other hand, the plasma CVD apparatus of Example 7 includes cylindrical electrodes. As shown in FIG. 12B, a cathode electrode 21 is provided so as to externally surround an internal anode electrode 22. Components of the apparatus 700 of Example 7 shown in FIG. 12A or 12B which are also provided in the apparatuses of Examples 1 to 6 are denoted by the same reference numerals.

Since the apparatus 700, having such a structure, is also a capacitance-coupled plasma CVD apparatus as is the apparatus of each of Examples 1 to 6, the problem of instable discharge occurs when a VHF high frequency is used for excitation. The apparatus 700 is an external-type apparatus, where the cathode electrode 21 and the electrode-side dielectrics 13 also serve as the wall of the reaction chamber 6. Therefore, there is an advantage that the impedance adjusting inductance $L_C$ formed by the coil 12 can be easily provided and adjusted as in Example 6.

The coil 12 is formed of a plurality of coil-shaped copper plates, and the impedance adjusting inductance $L_C$ is about 0.007 μH. Regarding the electrode size, the cathode electrode 21 has an inner diameter of about 20 cm, and the anode electrode 22 has a radius of about 10 cm, with the height of the anode electrode 22 being about 80 cm.

The dashed line in FIG. 13 represents the frequency dependency of the magnitude |Z| of the impedance between the cathode electrode 21 and the anode electrode 22 in a conventional plasma CVD apparatus where the impedance adjusting inductor 12 is not provided. On the other hand, the solid line in FIG. 13 represents the frequency dependency of the magnitude |Z| in Example 7, where the impedance adjusting inductor 12 is provided.

As can be seen from FIG. 13, the parallel resonance frequency $f_o$, which was about 32 MHz without the impedance adjusting inductor 12, is raised up to about 86 MHz by providing the impedance adjusting inductor 12, whereby plasma generation between the electrodes 21 and 22 can be achieved over frequencies of about 10 to 78 MHz.

EXAMPLE 8

Figure 14:
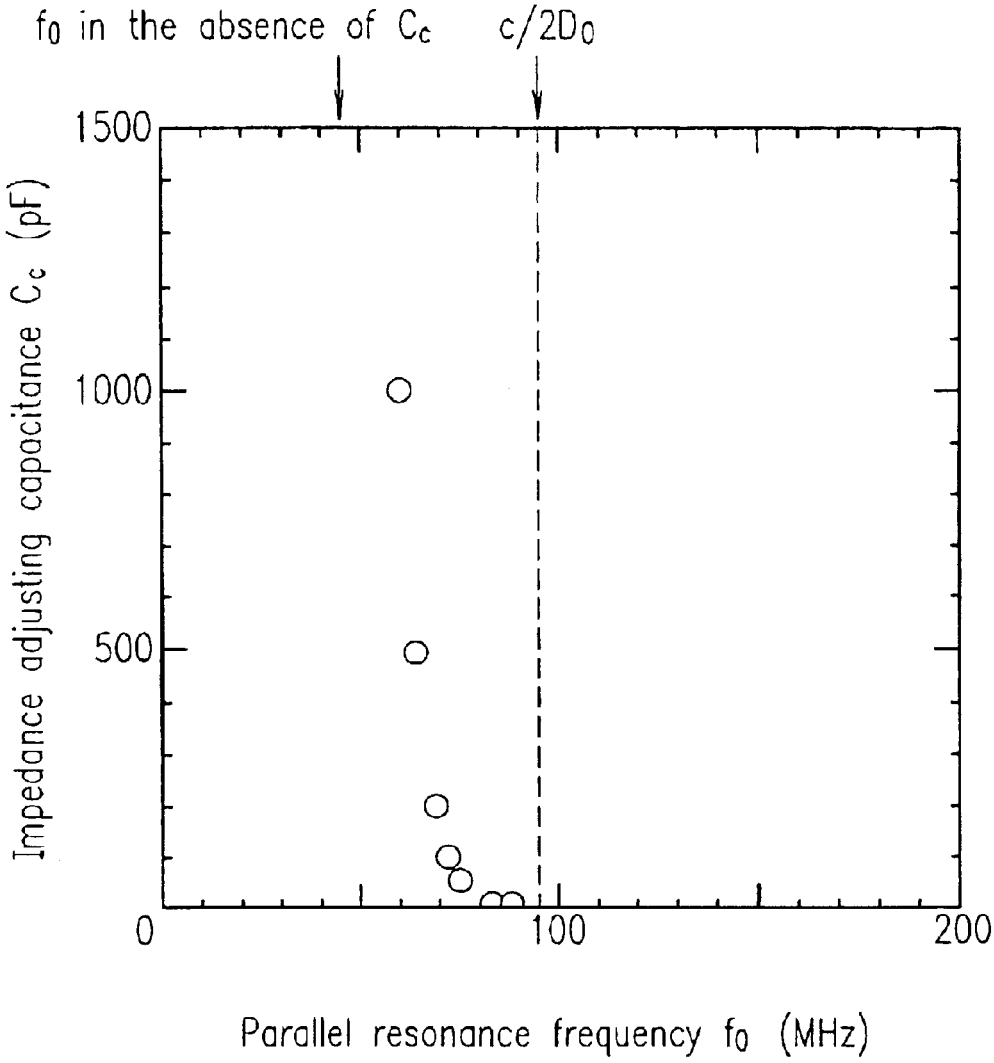
FIG. 14 is a graph illustrating the relationship between the parallel resonance frequency $f_o$ and the impedance adjusting capacitance $C_C$ according to Example 8 of the present invention, where the electronic device manufacturing apparatus of the present invention is implemented as a plasma CVD apparatus.

Referring to FIG. 14, an electronic device manufacturing apparatus according to Example 8 of the present invention will be described. In Example 8, any frequency from the RF range to the VHF range can be used for excitation by varying the impedance adjusting capacitance $C_C$ as in Example 1. Other conditions in Example 8 are the same as in Example 1. In Example 8, the apparatus size $D_o$ is about 1.6 m.

As can be seen from FIG. 14, by decreasing the impedance adjusting capacitance $C_C$, the parallel resonance frequency $f_o$ can be controlled up to the value defined by Expression (13).

Conversely, by varying the apparatus size $D_o$ (i.e., the size of the reaction chamber=the maximum length which can possibly be provided within the reaction chamber in parallel to the plane of the electrode), the control limit of the parallel resonance frequency $f_o$ can be varied. For example, when the apparatus size $D_o$ is decreased down to about 700 mm (which is about the size of the electrode), the parallel resonance frequency $f_o$ can be raised up to about 210 MHz, whereby inter-electrode discharge can be achieved over frequencies of up to about 200 MHz.

EXAMPLE 9

Figure 15:
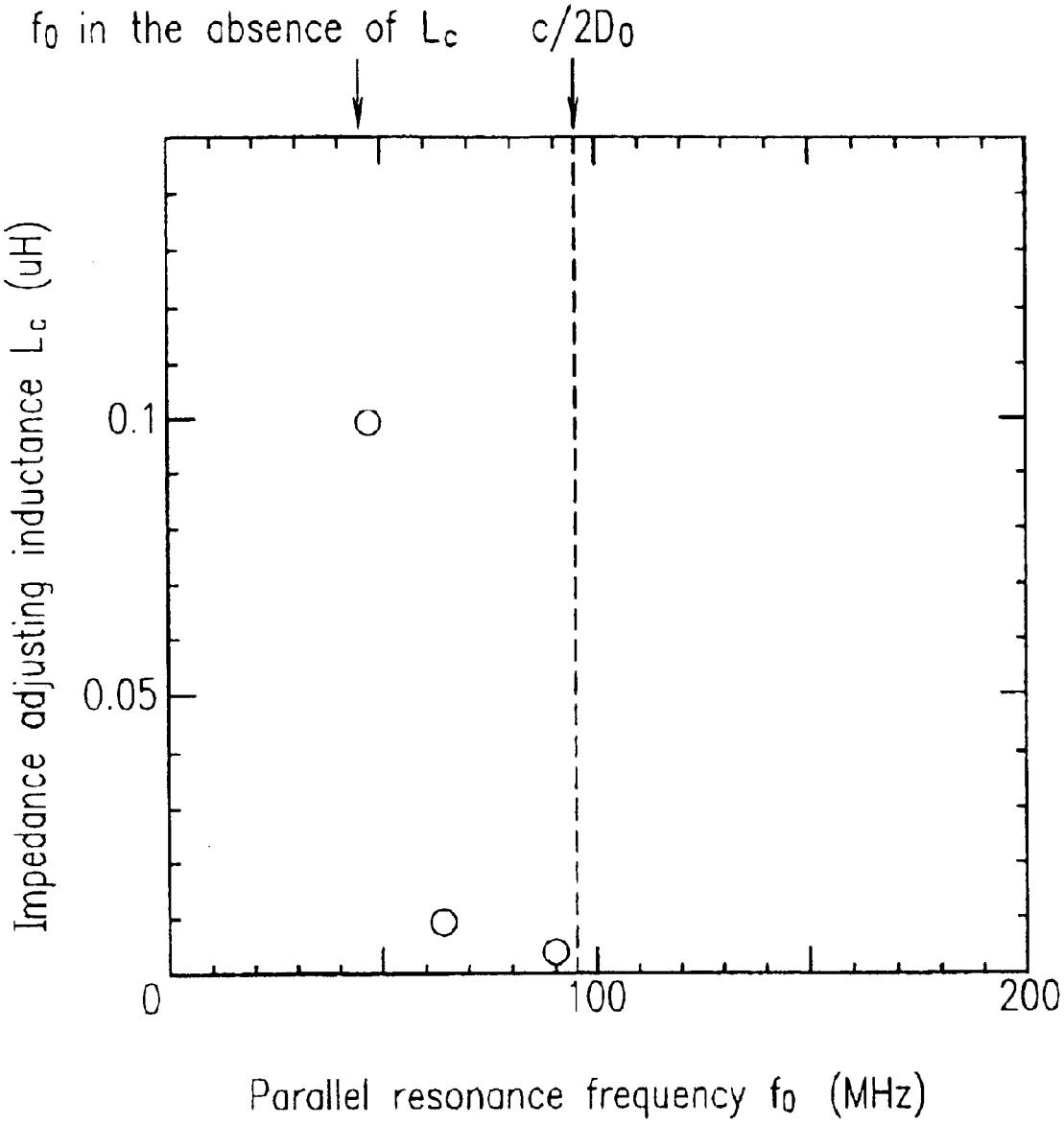
FIG. 15 is a graph illustrating the relationship between the parallel resonance frequency $f_o$ and the impedance adjusting capacitance $C_C$ according to Example 9 of the present invention, where the electronic device manufacturing apparatus of the present invention is implemented as a plasma CVD apparatus.

Referring to FIG. 15, an electronic device manufacturing apparatus according to Example 9 of the present invention will be described. In Example 9, any frequency from the RF range to the VHF range can be used for excitation by varying the impedance adjusting inductance $L_C$ while Expression (2) above is kept satisfied as in Example 4. Other conditions in Example 9 are the same as in Example 4. In Example 9, the apparatus size (length) $D_o$ is about 1.6 m.

As can be seen from FIG. 15, by decreasing the impedance adjusting inductance $L_C$, the parallel resonance frequency $f_o$ can be controlled up to the value defined by Expression (13).

Conversely, by varying the apparatus size $D_o$, the control limit of the parallel resonance frequency $f_o$ can be varied. For example, when the apparatus size (length) $D_o$ is decreased down to about 700 mm (which is about the length of the electrode), the parallel resonance frequency $f_o$ can be raised up to about 210 MHz, whereby inter-electrode discharge can be achieved over frequencies of up to about 200 MHz.

EXAMPLE 10

Figure 16:
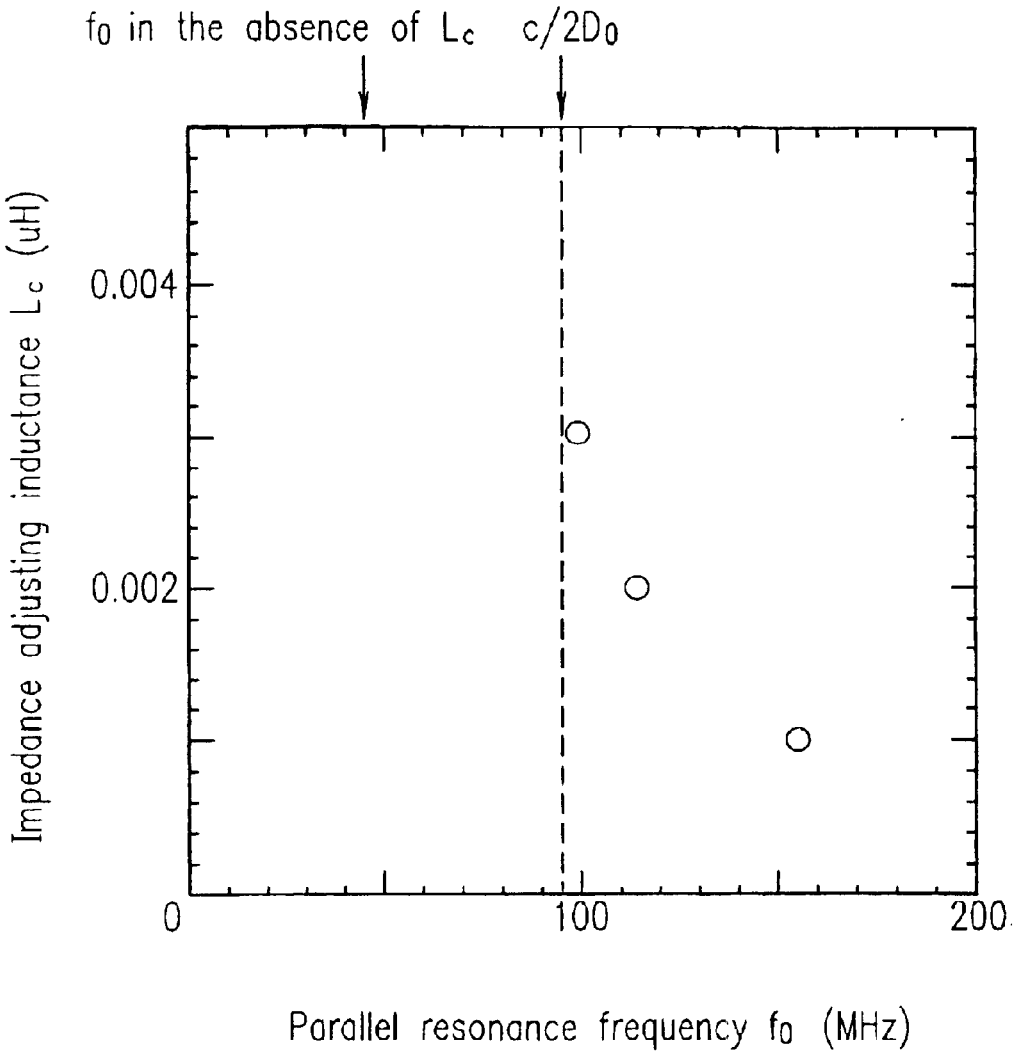
FIG. 16 is a graph illustrating the relationship between the parallel resonance frequency $f_o$ and the impedance adjusting capacitance $C_C$ according to Example 10 of the present invention, where the electronic device manufacturing apparatus of the present invention is implemented as a plasma CVD apparatus.

Referring to FIG. 16, an electronic device manufacturing apparatus according to Example 10 of the present invention will be described. In Example 10, any frequency from the RF range to the VHF range can be used for excitation by varying the impedance adjusting inductance $L_C$ while Expression (3) above is kept satisfied as in Example 4.

As can be seen from FIG. 16, by increasing the impedance adjusting inductance $L_C$, the parallel resonance frequency $f_o$ can be controlled even beyond the limit defined by Expression (13).

Theoretically, it is possible to infinitely increase the parallel resonance frequency $f_o$ or the maximum impedance. In accordance with Example 10, it was actually possible to achieve inter-electrode discharge at a frequency of about 135.6 MHz. This is effective for various types of apparatuses as it can be applied to the case where the apparatus size $D_o$ cannot be varied or to the case where the apparatus size is predetermined.

Hereinafter, a method for manufacturing electronic device according to the present invention will be briefly described.

Using any of the plasma CVD apparatuses described above in Examples 1 to 10, an electronic device can be manufactured with such high quality as shown in Table 1 above. In particular, a thin film is deposited on a substrate which is introduced within the reaction chamber through plasma excitation and plasma dissociation of a material gas. Thus, an electronic device requiring deposited films can be manufactured.

Moreover, it is possible to efficiently manufacture an electronic device including a high-quality large area film by etching a film using any of the electronic device manufacturing apparatuses in Examples 1 to 10, based on a principle that plasma particles and active species generated by plasma excitation can be used to etch a film.

In all the examples described above, a reaction gas introduced into the reaction chamber may be a material gas or a dilution gas when depositing a thin film semiconductor or the like. The reaction gas may be an etching gas when patterning a semiconductor device or the like.

When the electronic device manufacturing apparatus of the present invention is implemented as a high frequency plasma CVD apparatus, the parallel resonance frequency can be kept away from the excitation high frequency range. Thus, it is possible to generate plasma by a parallel-plate large-scale manufacturing apparatus having electrodes each about 1 m-by-1 m large using any frequency in a wide range of frequencies from the RF range to the VHF range. Therefore, in the field of giant microelectronics which involves the manufacturing of solar batteries for power supply, liquid crystal display devices, etc., it is possible to form an excitation high frequency electromagnetic field with higher frequencies and thereby to accommodate a substrate having a larger area. Thus, the present invention greatly contributes to the industry in enhancing the product quality, and dramatically increases the manufacturing efficiency.

With the conventional high frequency plasma CVD apparatus, normal inter-electrode discharge was not achieved with large-area electrodes or with the VHF frequency range. The present invention is particularly effective in achieving normal inter-electrode discharge under these conditions. According to the present invention, this is achieved simply by providing a dielectric, a coil or the like. Moreover, the present invention can be effectively implemented with a wide variety of electrode structures ranging from the internal-type structure, to the external-type structure, and to the drum-shape structure. Thus, as well as the field of giant microelectronics, the present invention is also useful in the field of photosensitive elements for electrophotography.

Similarly, when the present invention is implemented as a plasma dry etching apparatus where a film is etched by plasma particles and active species generated by plasma excitation, it is possible to use the VHF high frequencies in large-scale apparatuses used in the field of the manufacturing of liquid crystal display devices, and the like. Thus, the product quality can be improved from an industrial point of view, and manufacturing efficiency can also be improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An electronic device manufacturing apparatus comprising:

a reaction chamber including a wall having a ground potential level;

a reaction gas inlet for introducing a reaction gas into the reaction chamber;

a high frequency power generator for generating a high frequency voltage for exciting the reaction gas into plasma state or dissociated state; and a cathode electrode connected to the high frequency power generator; wherein a floating capacitance is defined between a potential level of the cathode electrode and the ground potential level, and further including an impedance adjusting capacitor positioned in series with the floating capacitance to suppress parallel resonance that occurs between the floating capacitance and [a capacitance] *an inductance* component formed between the cathode electrode and an anode electrode, the impedance adjusting capacitor having a capacitance value less than that of the floating capacitance.

2. An electronic device manufacturing apparatus according to claim 1, wherein the cathode electrode includes an upper cathode electrode and a lower cathode electrode, the apparatus further comprises a DC blocking capacitance element connected in series between the high frequency power generator and the lower cathode electrode, and the impedance adjusting capacitor is inserted between the upper and lower cathode electrodes.

3. An electronic device manufacturing apparatus according to claim 2, wherein the impedance adjusting capacitor insulates for a DC voltage the upper cathode electrode from the DC blocking capacitance element.

4. An electronic device manufacturing apparatus according to claim 1, wherein the impedance adjusting capacitor is inserted at such a location that the impedance adjusting capacitor is equivalently in series with the floating capacitance at a frequency of the high frequency power generator.

5. An electronic device manufacturing apparatus according to claim 1, wherein the impedance adjusting capacitor is formed so as to insulate for a DC voltage the cathode electrode from the high frequency power generator.

6. An electronic device manufacturing apparatus according to claim 1, wherein the impedance adjusting capacitor is formed of a dielectric which is provided on the cathode electrode.

7. An electronic device manufacturing apparatus according to claim 1, wherein, when capacitance of the impedance adjusting capacitor and the floating capacitance are connected in series with each other, a total capacitance C is set so as to satisfy Expression (1) below:

$$C \cdot \leqq 1/\{L_G \cdot (2\pi \cdot f)^2\} \quad (1)$$

where $L_G$ denotes a magnitude of an inductance component equivalently existing between the cathode electrode and a location which opposes an electrode surface of the cathode electrode and which has a ground potential, $\pi$ denotes pi (ratio of the circumference of a circle to the diameter), and f denotes the frequency of the high frequency voltage used for excitation.

8. An electronic device manufacturing apparatus according to claim 1, wherein the reaction gas is one of a material gas for depositing a thin film semiconductor and an etching gas for processing a semiconductor device.

9. An electronic device manufacturing apparatus according to claim 1, wherein: the cathode electrode is designed so as to satisfy Expression (4) below:

$$D \geqq (1/16) \cdot \lambda \quad (4)$$

where D denotes a maximum length of a surface of the cathode electrode, and $\lambda$ denotes a wavelength of the high frequency voltage for excitation.

10. An electronic device manufacturing apparatus according to claim 1, wherein the cathode electrode is designed so as to satisfy Expression (5) below:

$$D \geqq (1/8) \cdot \lambda \quad (5)$$

where D denotes a maximum length of a surface of the cathode electrode, and $\lambda$ denotes a wavelength of the high frequency voltage for excitation.

11. An electronic device manufacturing apparatus according to claim 1, wherein the reaction chamber is designed so as to satisfy Expression (6) below:

$$D_o \leqq (1/2)\cdot\lambda \quad (6)$$

where $D_o$ denotes a maximum length provided in the reaction chamber parallel to a surface of the cathode electrode, and $\lambda$ denotes a wavelength of the high frequency voltage for excitation.

12. An electronic device manufacturing apparatus according to claim 1, wherein a high frequency condition of the high frequency power generator is set to be continuous discharge in a high frequency VHF range.

13. An electronic device manufacturing apparatus according to claim 1, wherein a high frequency condition of the high frequency power generator is set to be pulse discharge in a high frequency VHF range.

14. An electronic device manufacturing apparatus comprising:

a reaction chamber including a wall having a ground potential level;

a reaction gas inlet for introducing a reaction gas into the reaction chamber;

a high frequency power generator for generating a high frequency power for exciting the reaction gas into plasma state or dissociated state; and a cathode electrode connected to the high frequency power generator; wherein a floating capacitance is defined between a potential level of the cathode electrode and the ground potential level, and further wherein an impedance adjusting inductor is positioned in parallel with the floating capacitance such that said impedance adjusting inductor suppresses parallel resonance that occurs between the floating capacitance and [a capacitance] *an inductance* component formed between the cathode electrode and an anode electrode.

15. An electronic device manufacturing apparatus according to claim 14, wherein the inductance component $L_C$ of the impedance adjusting inductor is set so as to satisfy Expression (2) below:

$$L_C \geqq 1/\{(2\cdot\pi\cdot f)^2\cdot C_F\} \quad (2).$$

16. An electronic device manufacturing apparatus according to claim 15, wherein the reaction chamber is designed so as to satisfy Expression (6) below:

$$D_o \leqq (1/2)\cdot\lambda \quad (6)$$

where $D_o$ changes a maximum length provided in the reaction chamber parallel to a surface of the cathode electrode, and $\lambda$ denotes a wavelength of the high frequency voltage.

17. An electronic device manufacturing apparatus according to claim 14, wherein the inductance component $L_C$ of the impedance adjusting inductor is set so as to satisfy Expression (3) below:

$$L_C < 1/\{(2\cdot\pi\cdot f)^2\cdot C_F\} \quad (3).$$

18. An electronic device manufacturing apparatus according to claim 17, wherein the reaction chamber is designed so as to satisfy Expression (7) below:

$$D_o \geqq (1/2)\cdot\lambda \quad (7)$$

where $D_o$ denotes a maximum length provided in the reaction chamber parallel to a surface of the cathode electrode, and $\lambda$ denotes a wavelength of the high frequency voltage for excitation.

19. An electronic device manufacturing apparatus according to claim 14, wherein: the cathode electrode is designed so as to satisfy Expression (4) below:

$$D \geqq (1/16)\cdot\lambda \quad (4)$$

where D denotes a maximum length of a surface of the cathode electrode, and $\lambda$ denotes a wavelength of the high frequency voltage for excitation.

20. An electronic device manufacturing apparatus according to claim 14, wherein the cathode electrode is designed so as to satisfy Expression (5) below:

$$D \geqq (1/8)\cdot\lambda \quad (5)$$

where D denotes a maximum length of a surface of the cathode electrode, and $\lambda$ denotes a wavelength of the high frequency voltage for excitation.

21. An electronic device manufacturing apparatus according to claim 14, wherein the impedance adjusting inductor is inserted at such a location that the impedance adjusting capacitor can be considered to be equivalently in parallel to the floating capacitance $C_F$ at a frequency of the high frequency power generator.

22. An electronic device manufacturing apparatus according to claim 14, wherein the impedance adjusting inductor short-circuits for a DC voltage the cathode electrode to a portion of the reaction chamber having the ground potential level.

23. An electronic device manufacturing apparatus according to claim 14, wherein an electrode-side dielectric is provided beside the cathode electrode, and the cathode electrode and the electrode-side dielectric form a bottom wall of the reaction chamber.

24. An electronic device manufacturing apparatus according to claim 14, wherein the cathode electrode is formed in a cylindrical shape, the anode electrode is provided inside the cathode electrode, an electrode-side dielectric is provided at an end of the cathode electrode, and the cathode electrode and the electrode-side dielectric form a wall of the reaction chamber.

25. An electronic device manufacturing apparatus according to claim 14, comprising an impedance adjusting capacitor inserted so as to be in series with the floating capacitance, wherein the impedance adjusting capacitor has a capacitance value less than that of the floating capacitance $C_F$.

26. An electronic device manufacturing apparatus according to claim 14, wherein a high frequency condition of the high frequency power generator is set to be continuous discharge in a high frequency VHF range.

27. An electronic device manufacturing apparatus according to claim 14, wherein a high frequency condition of the high frequency power generator is set to be pulse discharge in a high frequency VHF range.

28. An electronic device manufacturing apparatus according to claim 14, wherein the reaction gas is one of a material gas for depositing a thin film semiconductor and an etching gas for processing a semiconductor device.

* * * * *